(12) United States Patent
Uchida et al.

(10) Patent No.: US 10,157,967 B2
(45) Date of Patent: Dec. 18, 2018

(54) ORGANIC ELECTROLUMINESCENCE DEVICE, ILLUMINATION DEVICE, AND DISPLAY DEVICE

(71) Applicant: Sharp Kabushiki Kaisha, Sakai, Osaka (JP)

(72) Inventors: Hideki Uchida, Sakai (JP); Katsuhiro Kikuchi, Sakai (JP); Satoshi Inoue, Sakai (JP); Eiji Koike, Sakai (JP); Masanori Ohara, Sakai (JP); Yuto Tsukamoto, Sakai (JP); Yoshiyuki Isomura, Sakai (JP); Kazuki Matsunaga, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 19 days.

(21) Appl. No.: 15/529,519

(22) PCT Filed: Nov. 24, 2015

(86) PCT No.: PCT/JP2015/082820
§ 371 (c)(1),
(2) Date: May 25, 2017

(87) PCT Pub. No.: WO2016/084759
PCT Pub. Date: Jun. 2, 2016

(65) Prior Publication Data
US 2017/0317148 A1    Nov. 2, 2017

(30) Foreign Application Priority Data

Nov. 28, 2014    (JP) ................................ 2014-241212

(51) Int. Cl.
*H01L 27/32*    (2006.01)
*H01L 51/50*    (2006.01)
(Continued)

(52) U.S. Cl.
CPC ............ *H01L 27/3211* (2013.01); *G09F 9/30* (2013.01); *H01L 27/32* (2013.01);
(Continued)

(58) Field of Classification Search
CPC .......... H01L 27/32; H01L 51/50; H01L 51/52
See application file for complete search history.

(56) References Cited

U.S. PATENT DOCUMENTS

2003/0230972 A1    12/2003   Cok
2011/0298361 A1    12/2011   Matsunaga et al.
(Continued)

FOREIGN PATENT DOCUMENTS

JP    2003-229283 A    8/2003
JP    2004-022541 A    1/2004
(Continued)

*Primary Examiner* — Kenneth Parker
*Assistant Examiner* — Long H Le
(74) *Attorney, Agent, or Firm* — ScienBiziP, P.C.

(57) ABSTRACT

An organic electroluminescence device according to one aspect of the present invention includes: a base material having a top surface on which a recess is provided; a reflective layer provided along at least a surface of the recess; a filling layer filled inside the recess via the reflective layer, the filling layer having light transmissivity; a first electrode provided at least on an upper layer side of the filling layer, the first electrode having light transmissivity; an organic layer provided on an upper layer side of the first electrode, the organic layer including at least a light emitting layer; and a second electrode provided on an upper layer side of the organic layer, the second electrode having light transmissivity, wherein a coloring material is mixed into the filling layer.

15 Claims, 15 Drawing Sheets

Figure 1:
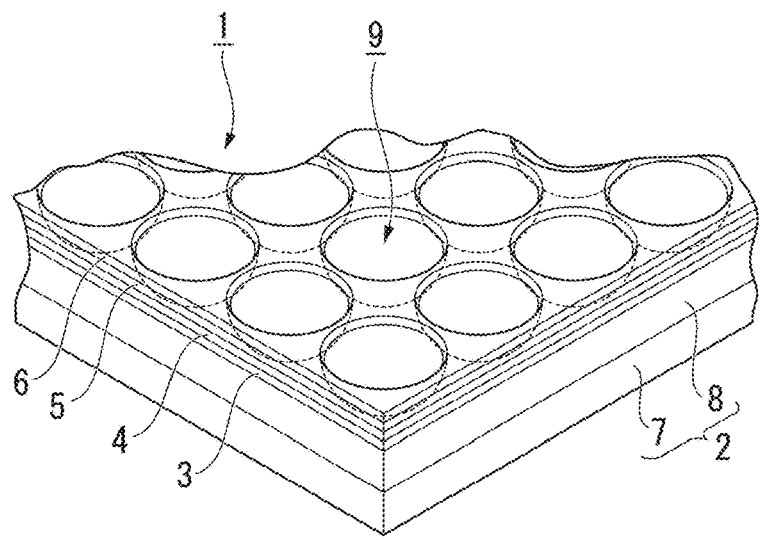

(51) Int. Cl.
*H01L 51/52* (2006.01)
*G09F 9/30* (2006.01)
*G02B 5/20* (2006.01)

(52) U.S. Cl.
CPC .......... *H01L 27/3209* (2013.01); *H01L 51/50* (2013.01); *H01L 51/5036* (2013.01); *H01L 51/5215* (2013.01); *H01L 51/5234* (2013.01); *H01L 51/5271* (2013.01); *G02B 5/205* (2013.01); *H01L 27/322* (2013.01); *H01L 2251/5315* (2013.01); *H01L 2251/5369* (2013.01)

(56) References Cited

U.S. PATENT DOCUMENTS

| 2014/0167018 | A1 | 6/2014 | Okumoto et al. | |
|---|---|---|---|---|
| 2014/0312339 | A1* | 10/2014 | Fujita | H01L 27/322 |
| | | | | 257/40 |
| 2015/0270512 | A1* | 9/2015 | Yamae | H01L 51/5268 |
| | | | | 257/40 |
| 2017/0222173 | A1* | 8/2017 | Matsusue | H01L 51/5044 |

FOREIGN PATENT DOCUMENTS

| JP | 2006-318842 A | 11/2006 |
|---|---|---|
| JP | 2010-010020 A | 1/2010 |
| JP | 2010-198735 A | 9/2010 |
| JP | 2011-228229 A | 11/2011 |
| JP | 2012-256503 A | 12/2012 |
| JP | 2013-140679 A | 7/2013 |
| WO | 2013/011599 A1 | 1/2013 |
| WO | 2014/141702 A1 | 9/2014 |

\* cited by examiner

ORGANIC ELECTROLUMINESCENCE DEVICE, ILLUMINATION DEVICE, AND DISPLAY DEVICE

TECHNICAL FIELD

Some aspects of the present invention relates to an organic electroluminescence device, an illumination device and a display device.

Priority is claimed on Japanese Patent Application No. 2014-241212, filed Nov. 28, 2014, the content of which is incorporated herein by reference.

BACKGROUND ART

As one form of a display device, a self-luminous type display device, for example, an organic electroluminescence display device, is known. Electro-luminescence will be abbreviated as "EL" below. In an organic EL display device, light emitted from a light emitting layer travels in all directions, and some of the light is totally reflected due to a refractive index difference between a light emitting element and an external space (air). Most of the light totally reflected at the interface between the light emitting element and the air is confined in the light emitting element and is not extracted to the external space. For example, when the refractive index of the light emitting layer is 1.8, about 20% of the light emitted from the light emitting layer is extracted to the external space and the remaining about 80% of light is confined in the light emitting layer. As a result, the organic EL device of the related art has a problem of low light use efficiency.

In the following Patent Document 1, an organic EL display device including a support substrate, an organic EL element provided on the support substrate, and a light reflection layer at which light emitted from the organic EL element is reflected is disclosed. In the organic EL display device, in the light reflection layer, a recess including an inclined surface along the outer edge of an organic light-emitting layer is provided. Light emitted from the organic light-emitting layer is reflected at the inclined surface of the recess and is then returned to the organic EL element again. In such a configuration, it is possible to prevent degradation of image quality such as bleeding and improve light use efficiency, which are described in the Patent Document 1.

PRIOR ART DOCUMENT

Patent Document

[Patent Document 1]
Japanese Patent Application Publication No. 2003-229283

SUMMARY OF THE INVENTION

Problem to be Solved by the Invention

In Patent Document 1, the light reflection layer bends a travelling direction of a light emitting component being guided and thus light extraction efficiency is improved. However, since the upper electrode is a translucent electrode, a light component that should be emitted to the front surface is reflected into a recessed groove again in the upper electrode. Light entering the recessed groove again has an angle that is changed due to reflection at the reflective layer. Therefore, a light component emitted in the forward direction may be reduced in magnitude. Accordingly, the light extraction efficiency may not be higher than the expected efficiency, and particularly, there is a problem that forward luminance may not be significantly higher.

In addition, emission spectrums of light emitting materials are generally broad in many cases. Therefore, when a high color purity is required as in, for example, a display, a spectrum of a fluorescent body may not satisfy desired specifications.

An aspect of the present invention has been made in view of the above problem in the related art and can provide an organic electroluminescence device, an illumination device, and a display device through which it is possible to improve both a color purity and a light extraction efficiency.

Means for Solving the Problems

An organic electroluminescence device according to one aspect of the present invention includes: a base material having a top surface on which a recess is provided; a reflective layer provided along at least a surface of the recess; a filling layer filled inside the recess via the reflective layer, the filling layer having light transmissivity; a first electrode provided at least on an upper layer side of the filling layer, the first electrode having light transmissivity; an organic layer provided on an upper layer side of the first electrode, the organic layer including at least a light emitting layer; and a second electrode provided on an upper layer side of the organic layer, the second electrode having light transmissivity, wherein a coloring material is mixed into the filling layer.

In the organic electroluminescence device according to one aspect of the present invention, a configuration may be used that an absorption wavelength range of the filling layer overlaps a part of an emission spectrum of light emitted from the light emitting layer.

In the organic electroluminescence device according to one aspect of the present invention, a configuration may be used that a color filter layer is further provided on the second electrode.

In the organic electroluminescence device according to one aspect of the present invention, a configuration may be used that a refractive index of the filling layer is substantially same as a refractive index of a main component material of the light emitting layer.

In the organic electroluminescence device according to one aspect of the present invention, a configuration may be used that a refractive index of the filling layer is substantially same as a refractive index of the first electrode.

In the organic electroluminescence device according to one aspect of the present invention, a configuration may be used that a luminescent color of light emitted from the organic layer has peak wavelengths of at least two or more colors.

In the organic electroluminescence device according to one aspect of the present invention, a configuration may be used that the light emitting layer emits white light.

In the organic electroluminescence device according to one aspect of the present invention, a configuration may be used that the light emitting layer includes a plurality of light emitting units and a charge generating layer, the plurality of light emitting units including an electron transporting layer (ETL), a light emitting layer (EML), a hole transporting layer (HTL), and a hole injecting layer (HIL), and that the first light emitting unit, the charge generating layer, and the second light emitting unit are laminated on the first electrode in that order.

In the organic electroluminescence device according to one aspect of the present invention, a configuration may be used that a coloring component of the filling layer has an absorption spectrum substantially matching a peak wavelength of one color among light emitting components having peak wavelengths of two or more colors.

In the organic electroluminescence device according to one aspect of the present invention, a configuration may be used that a color filter layer is further provided on the second electrode.

In the organic electroluminescence device according to one aspect of the present invention, a configuration may be used that a part of the reflective layer is in contact with a part of the first electrode.

In the organic electroluminescence device according to one aspect of the present invention, a configuration may be used that a bottom surface of the first electrode at a position of the recess is positioned lower than a plane including a top surface of the base material.

In the organic electroluminescence device according to one aspect of the present invention, a configuration may be used that the recess has an arc shape in at least one axial direction.

An illumination device according to one aspect of the present invention includes: a base material having a top surface on which a recess is provided; a reflective layer provided along at least a surface of the recess; a filling layer filled inside the recess via the reflective layer, the filling layer having light transmissivity; a first electrode provided at least on an upper layer side of the filling layer, the first electrode having light transmissivity; an organic layer provided on an upper layer side of the first electrode, the organic layer including at least a light emitting layer; and a second electrode provided on an upper layer side of the organic layer, the second electrode having light transmissivity, wherein a coloring material is mixed into the filling layer.

A display device according to one aspect of the present invention includes: a base material having a top surface on which a recess is provided; a reflective layer provided along at least a surface of the recess; a filling layer filled inside the recess via the reflective layer, the filling layer having light transmissivity; a first electrode provided at least on an upper layer side of the filling layer, the first electrode having light transmissivity; an organic layer provided on an upper layer side of the first electrode, the organic layer including at least a light emitting layer; and a second electrode provided on an upper layer side of the organic layer, the second electrode having light transmissivity, wherein a coloring material is mixed into the filling layer.

Effect of the Invention

According to an aspect of the present invention, it is possible to provide an organic electroluminescence device, an illumination device, and a display device through which it is possible to improve both a color purity and a light extraction efficiency.

BRIEF DESCRIPTIONS OF THE DRAWINGS

Figure 2:
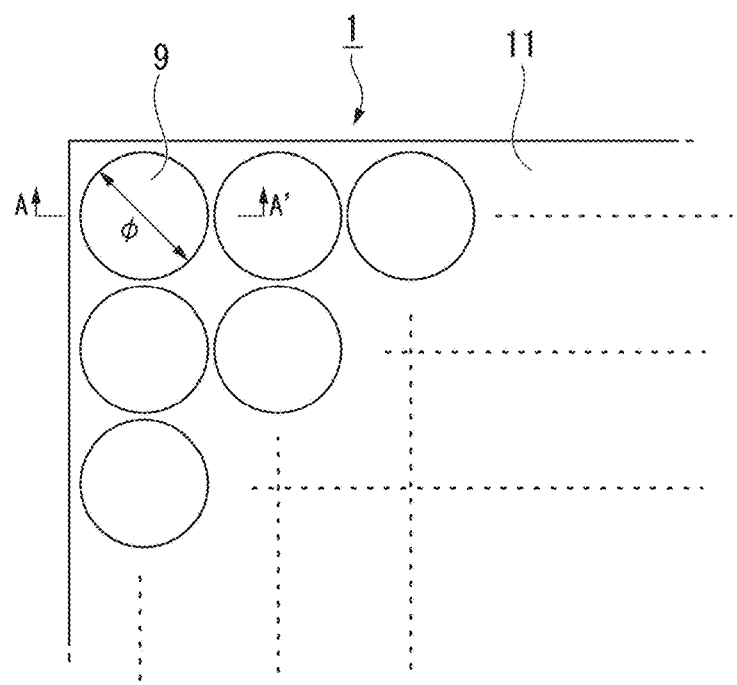
Figure 3:
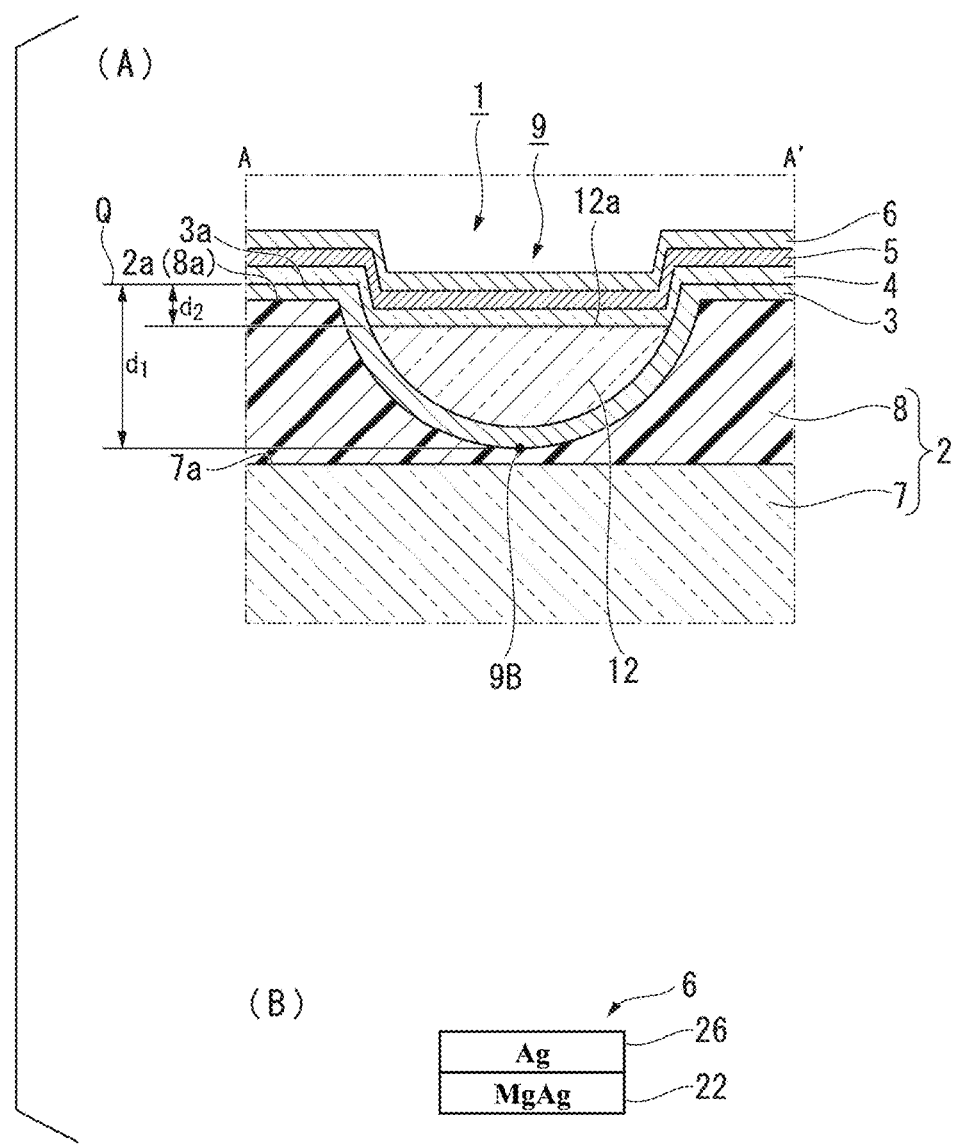
Figure 4:
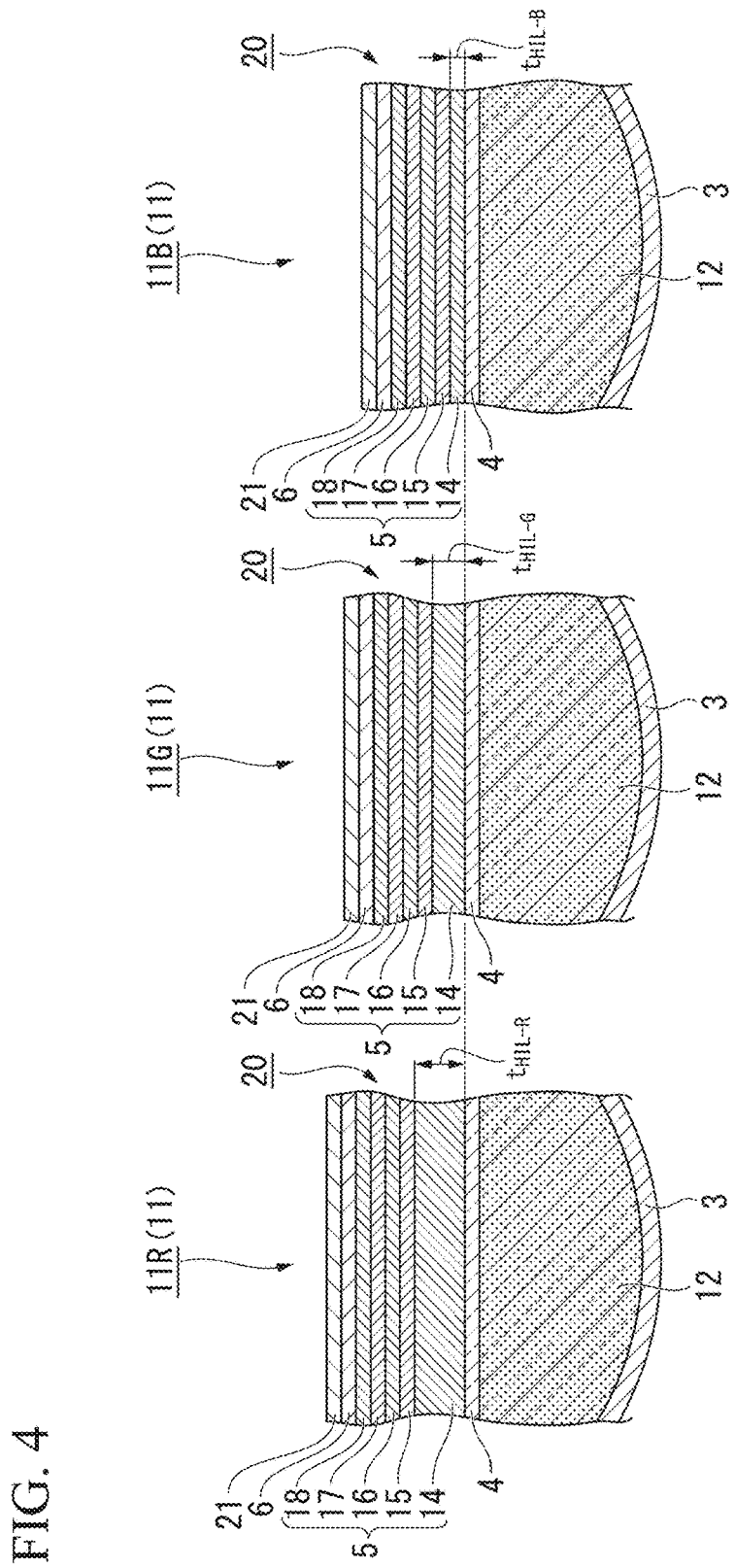
Figure 5:
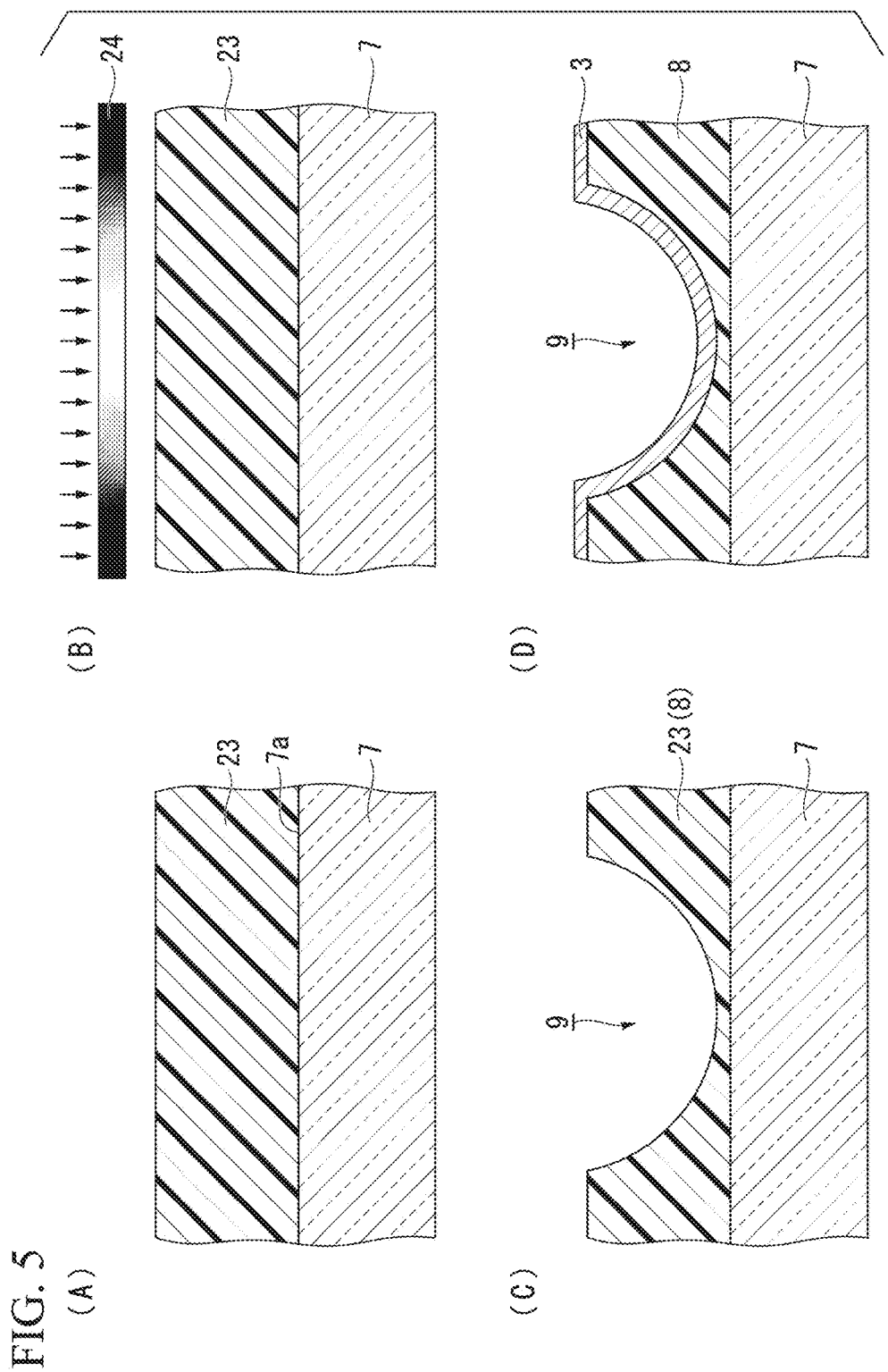
Figure 6:
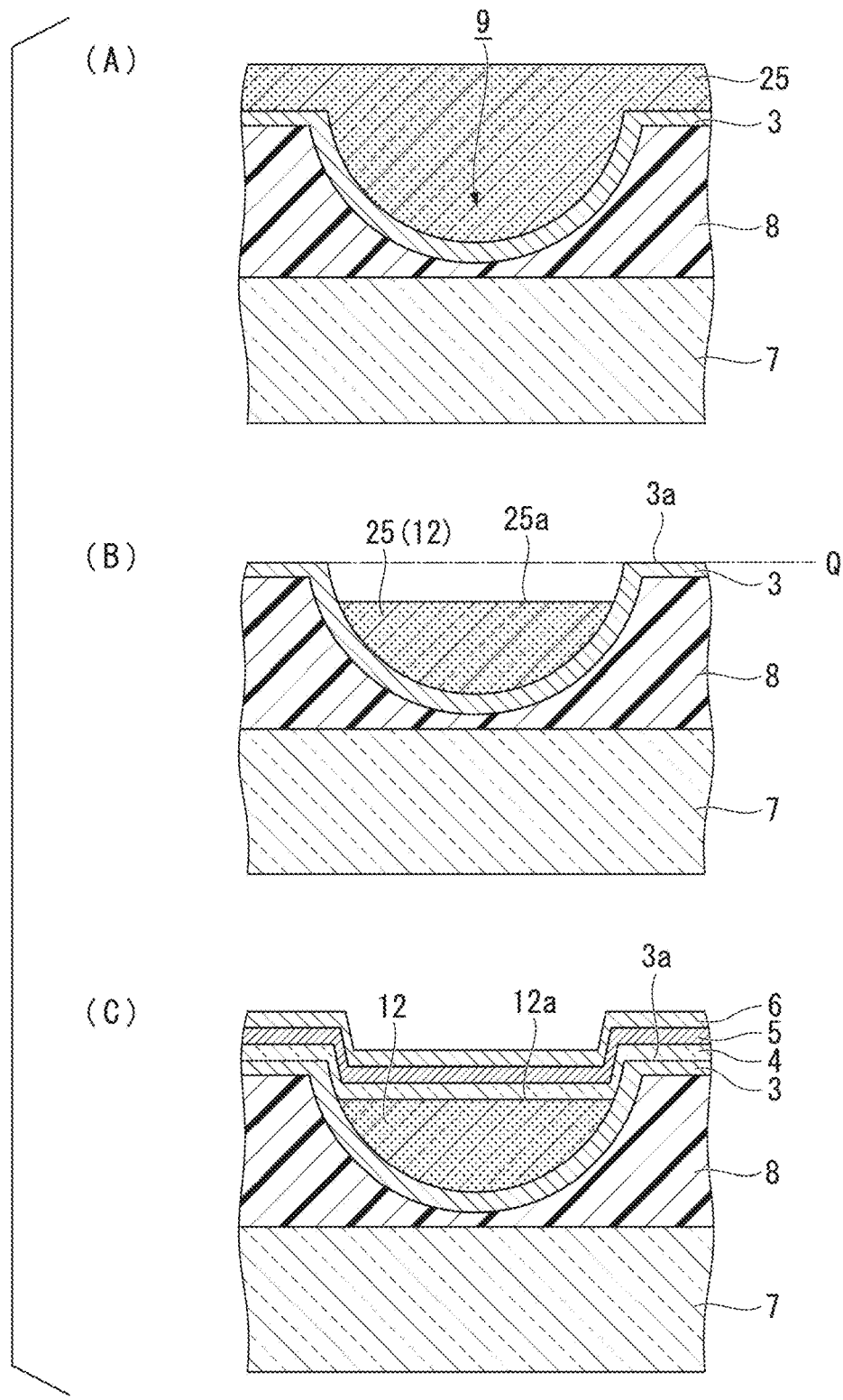
Figure 7:
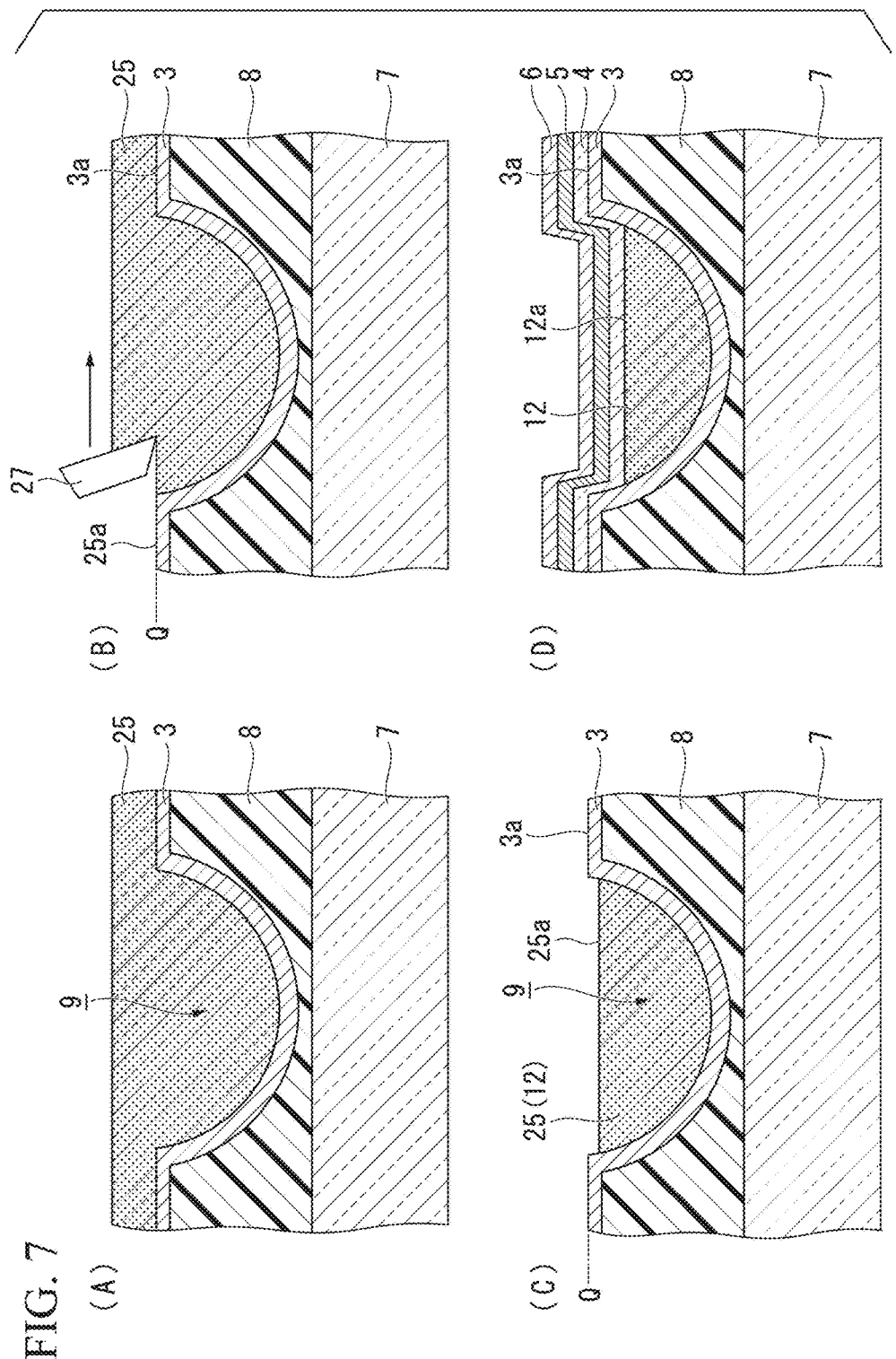
Figure 8:
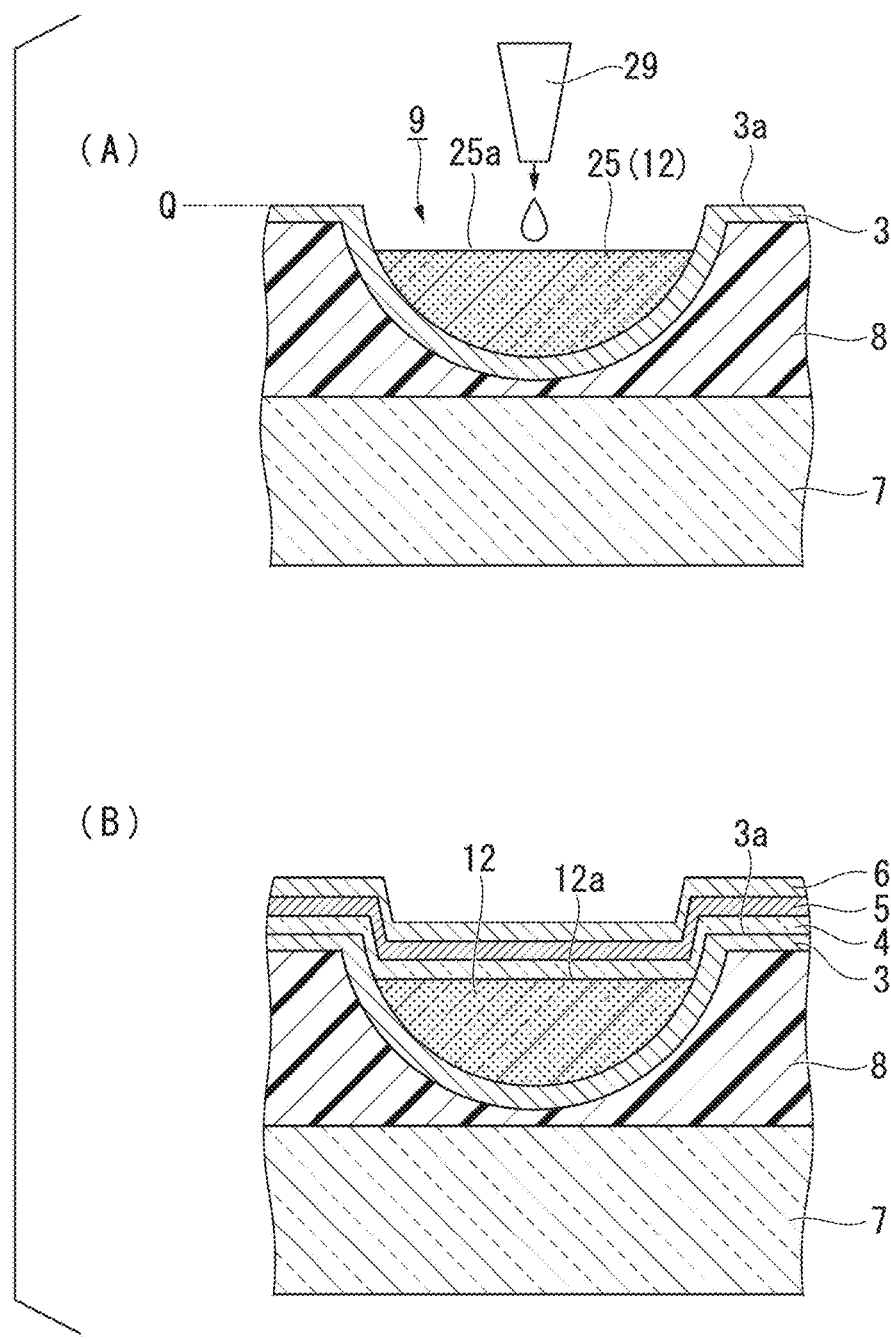
Figure 9:
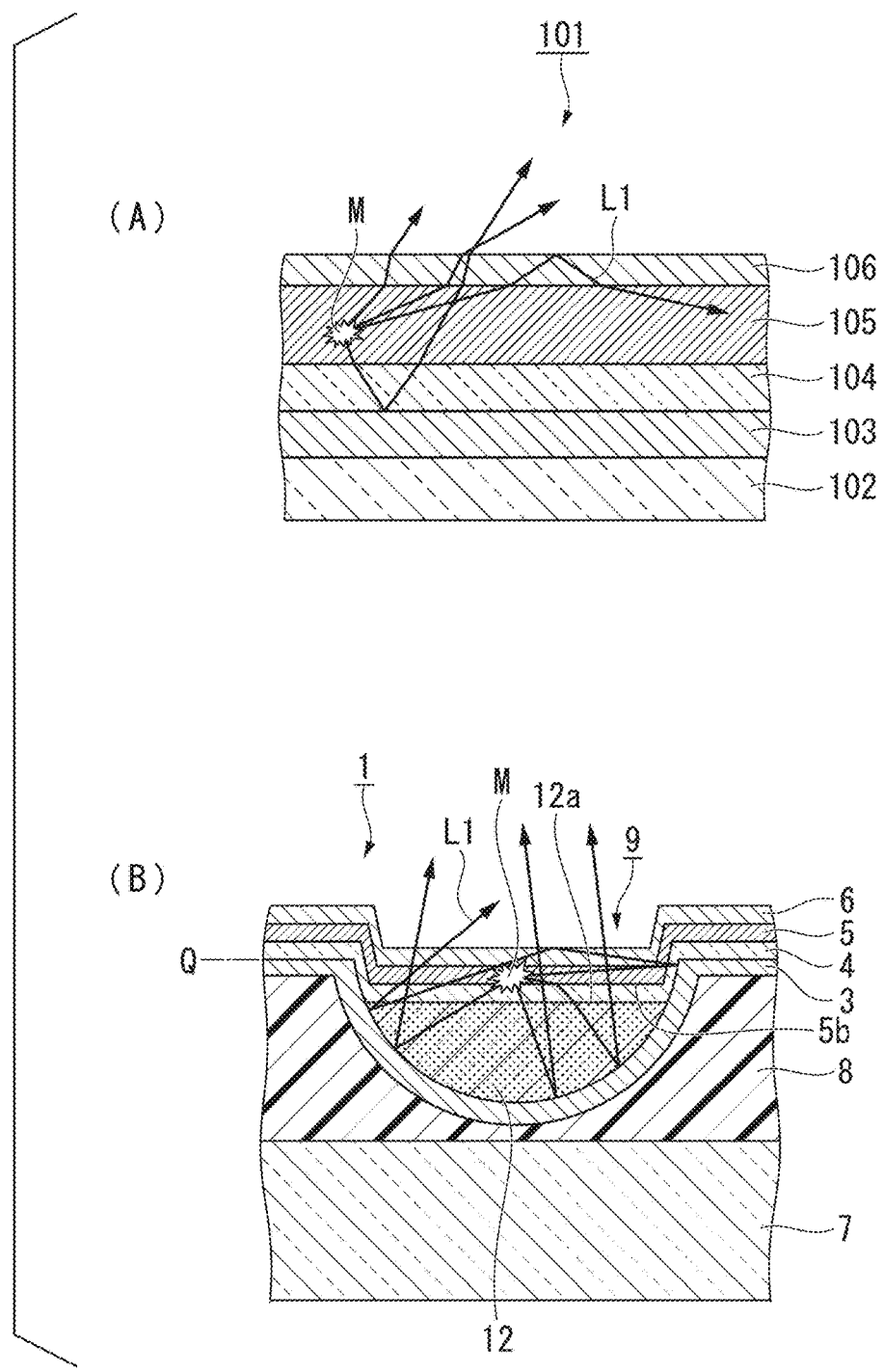
Figure 10:
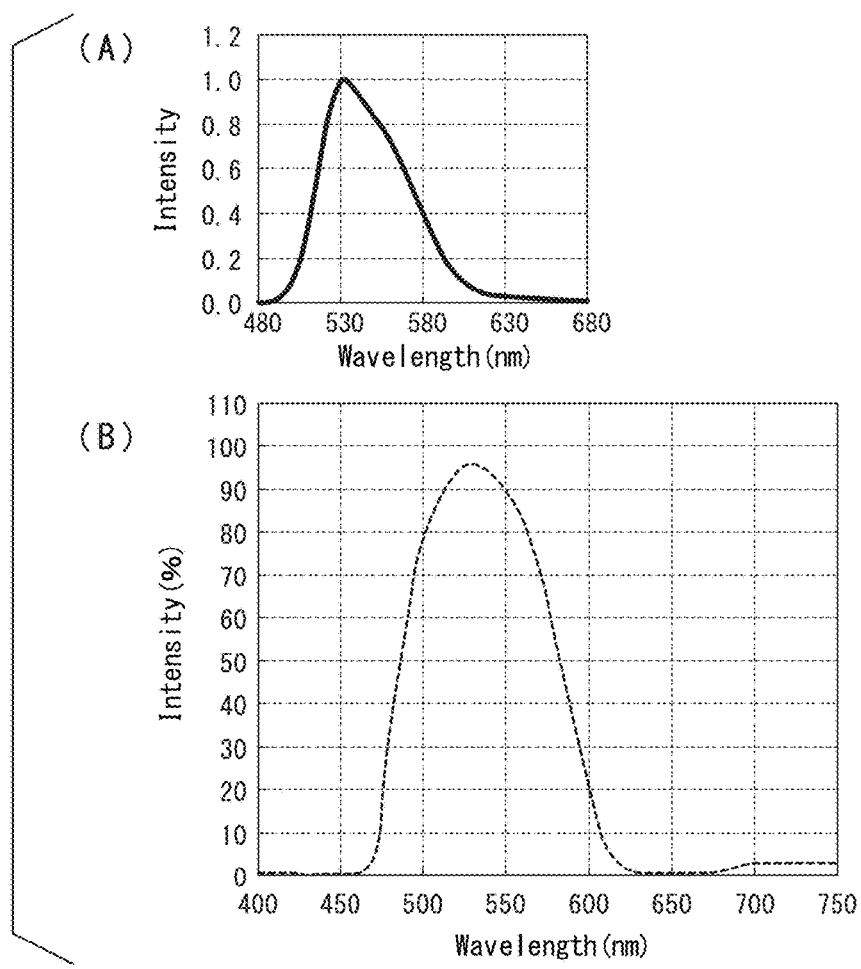
Figure 11:
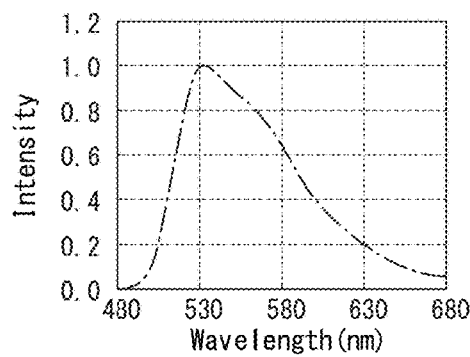
Figure 12:
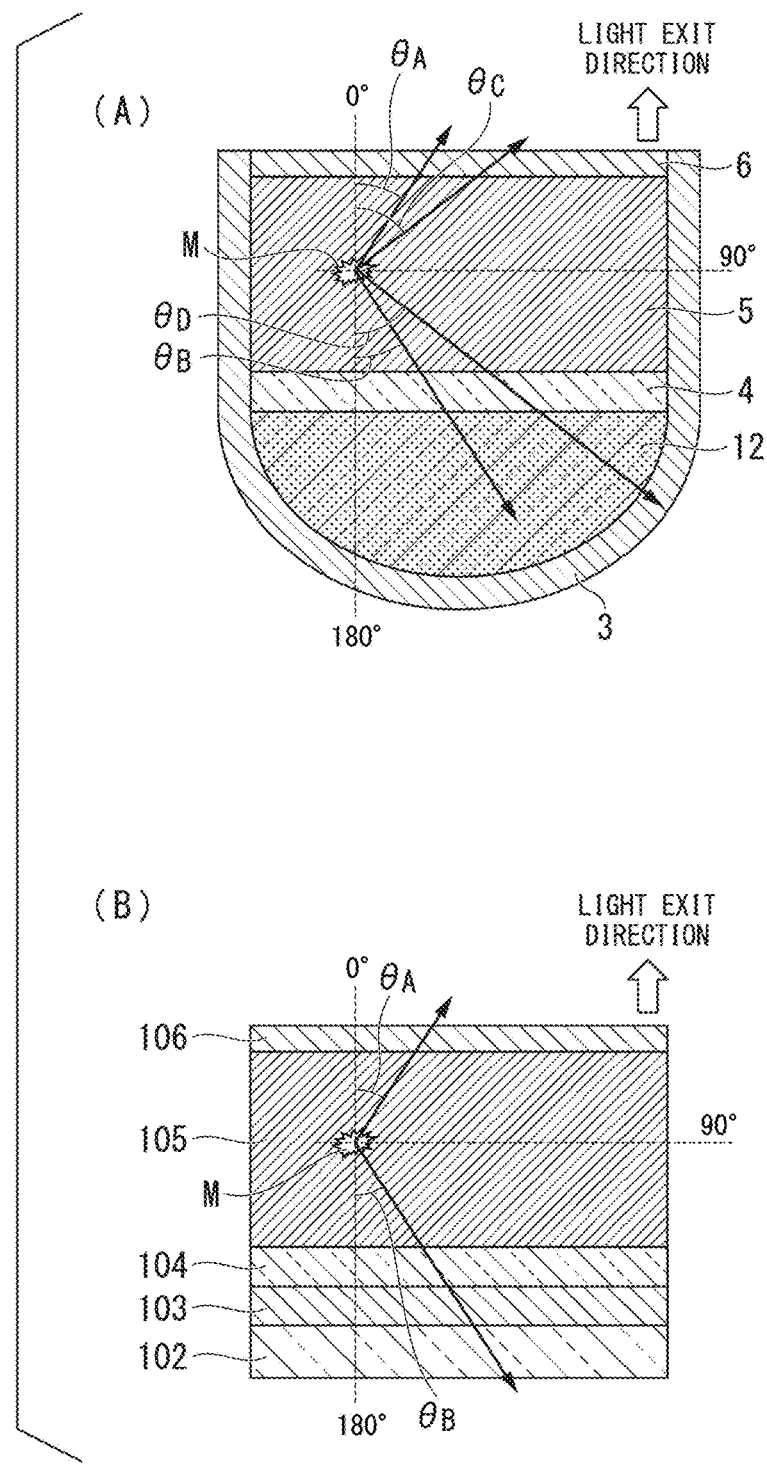
Figure 13:
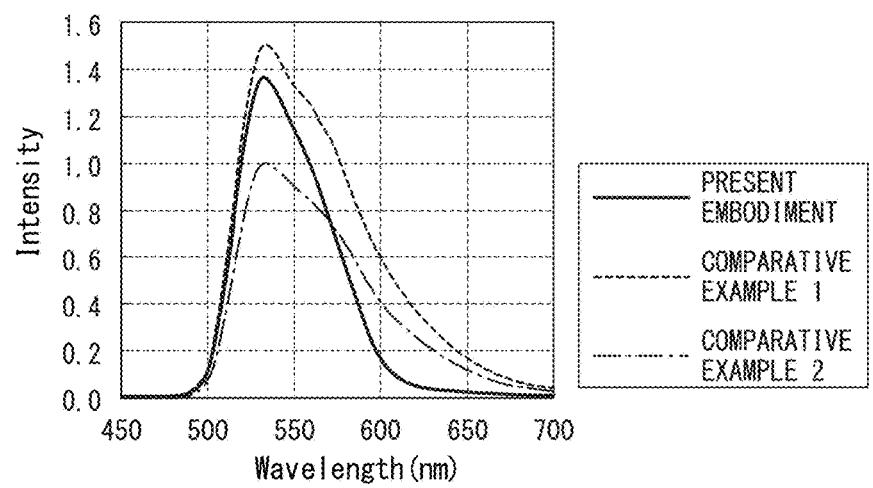
Figure 14:
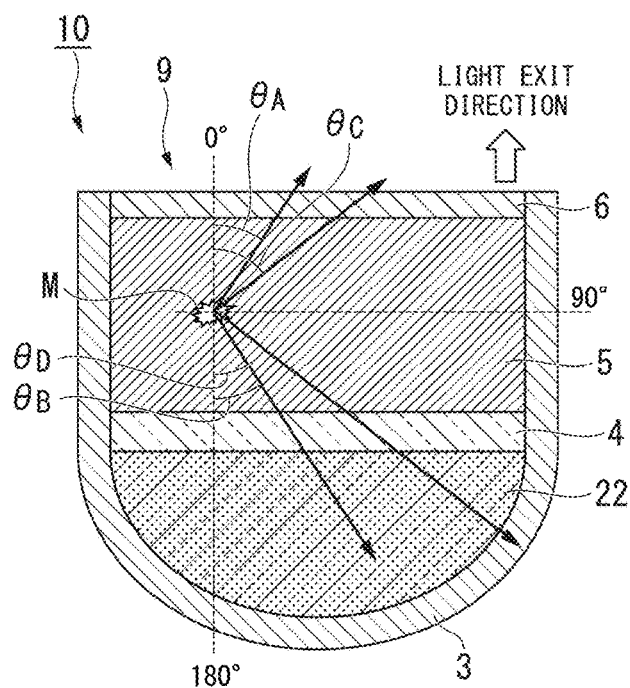
Figure 15:
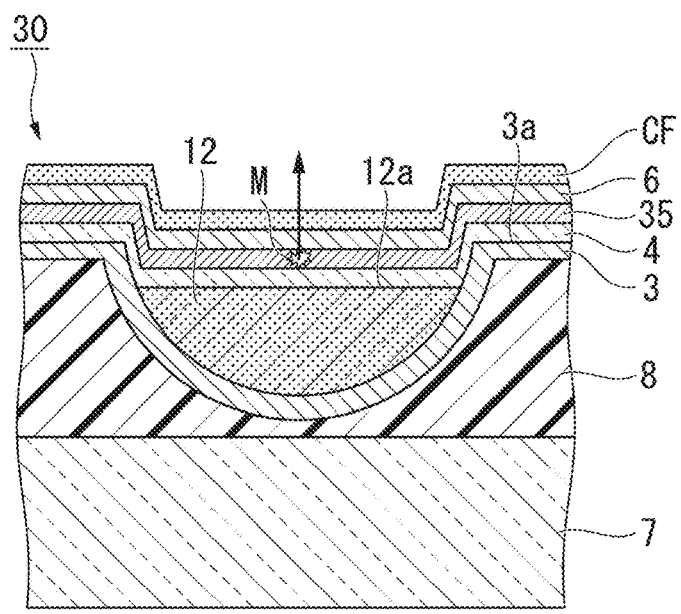
Figure 16:
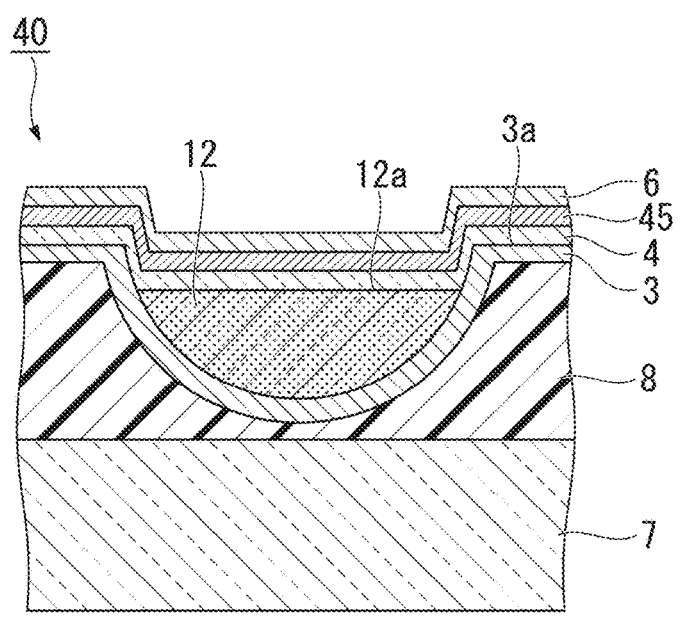
Figure 17:
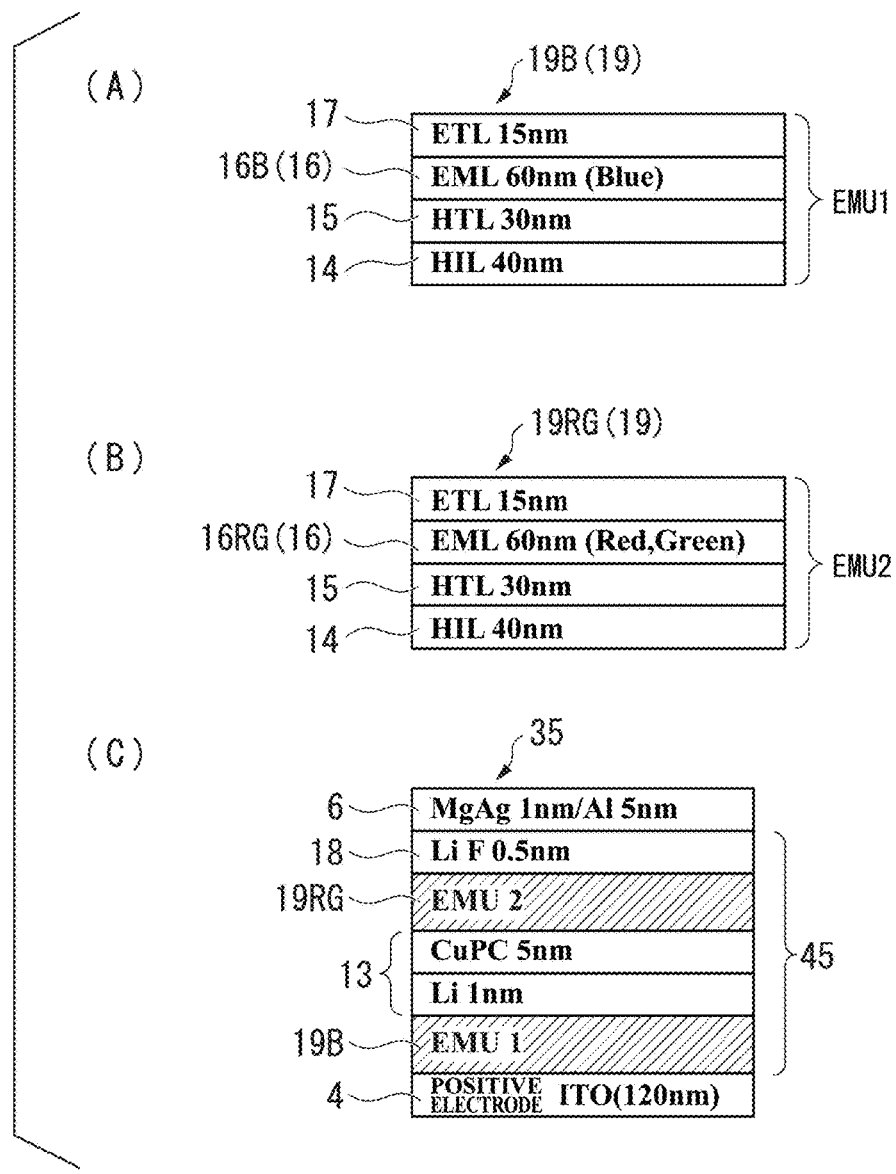
Figure 18:
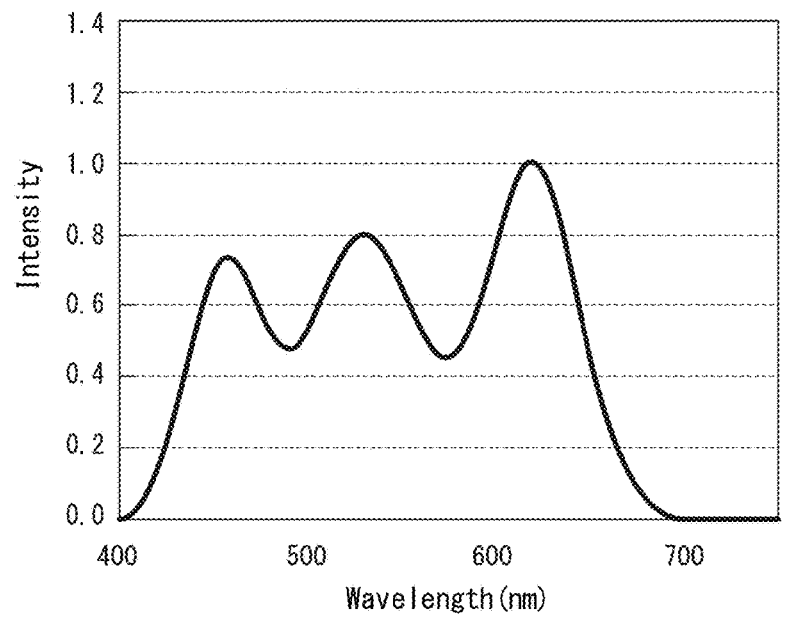
Figure 19:
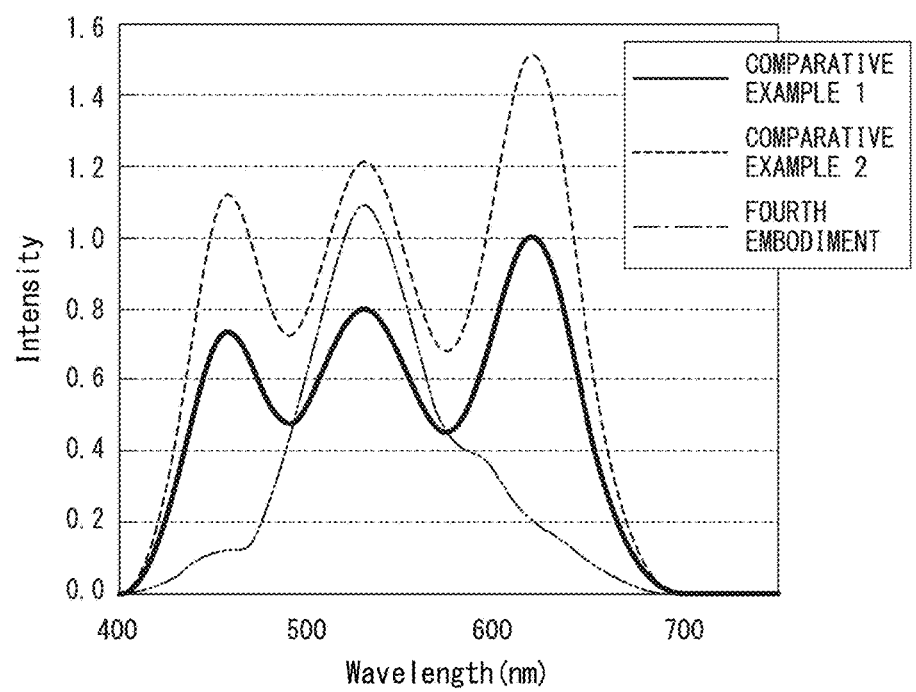
Figure 20:
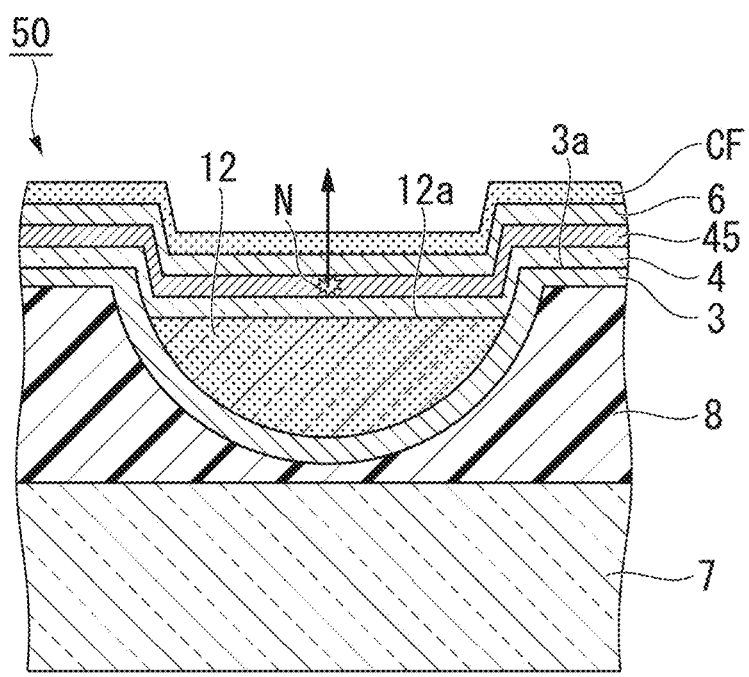

FIG. 1 is a perspective view of an organic EL device according to a first embodiment.
FIG. 2 is a plan view of an enlarged part of one unit light emitting area.
FIG. 3(A) is a cross-sectional view of an organic EL device taken along any plane perpendicular to a top surface of a base material, and FIG. 3(B) is a diagram showing a configuration of a second electrode.
FIG. 4 shows cross-sectional views of detailed configurations of color unit light emitting areas.
FIG. 5 is a diagram showing a process of manufacturing an organic EL device.
FIG. 6 is a diagram showing a process of manufacturing an organic EL device.
FIG. 7 is a diagram showing a process of manufacturing an organic EL device.
FIG. 8 is a diagram showing a process of manufacturing an organic EL device.
FIG. 9(A) is a cross-sectional view showing an organic EL device having no recess structure in the related art, and FIG. 9(B) is a cross-sectional view showing an organic EL device of the present embodiment having a recess structure.
FIG. 10(A) is a graph showing an emission spectrum of a green light emitting material, and FIG. 10(B) is a graph showing a transmission spectrum of a color filter.
FIG. 11 is a graph showing an emission spectrum of a green light emitting material after passing through a filling layer.
FIG. 12(A) is a diagram for describing a light extraction efficiency in an organic EL device according to the first embodiment, and FIG. 12(B) is a diagram for describing a light extraction efficiency in an organic EL device of the related art.
FIG. 13 is a graph showing emission spectrum characteristics of organic EL elements according to Comparative Example 1, Comparative Example 2, and the present embodiment.
FIG. 14 is a diagram for describing a configuration and an operation of an organic EL device according to a second embodiment.
FIG. 15 is a diagram for describing a configuration and an operation of an organic EL device according to a third embodiment.
FIG. 16 is a diagram showing a configuration of an organic EL device according to a fourth embodiment.
FIG. 17(A) is a diagram showing a configuration of a blue light emitting unit. FIG. 17(B) is a diagram showing a configuration of a green and red light emitting unit. FIG. 17(C) is a diagram showing a configuration of a white light emitting organic EL element.
FIG. 18 is a graph showing an emission spectrum of a white light emitting element having a back emission structure.
FIG. 19 is a graph showing emission spectrums of the above three organic EL elements.
FIG. 20 is a diagram showing a configuration of an organic EL device according to a fifth embodiment.

EMBODIMENTS FOR CARRYING OUT THE INVENTION

Embodiments of the present invention will be described below with reference to the drawings. Note that, in the drawings used in the following description, scales of members are appropriately changed in order for the members to be made recognizable sizes.

First Embodiment

A first embodiment of the present invention will be described below with reference to FIG. 1 to FIG. 10.

An organic EL device of the first embodiment is one example of a top emission type organic EL device having a microcavity structure.

FIG. 1 is a perspective view of the organic EL device of the first embodiment.

As shown in FIG. 1, an organic EL device 1 of the present embodiment includes a base material 2, a reflective layer 3, a colored filling layer 12 (FIG. 3), a first electrode 4, an organic layer 5 containing a light emitting layer, and a second electrode 6.

The organic EL device 1 is a top emission type organic EL device, and light emitted from the light emitting layer is emitted from the second electrode 6. The base material 2 includes a substrate 7 and an underlayer 8. On a top surface of the substrate 7, the underlayer 8, the reflective layer 3, a colored filling layer (a filling layer) 12 (FIG. 3), the first electrode 4, the organic layer 5, and the second electrode 6 are laminated in that order from the substrate 7. A plurality of recesses 9 are provided on a top surface (a light emission surface) of the organic EL device 1.

The organic EL device 1 includes a plurality of unit light emitting areas that are divided from each other. The plurality of unit light emitting areas include a red light emitting area in which red light is emitted, a green light emitting area in which green light is emitted, and a blue light emitting area in which blue light is emitted. The red light emitting area, the green light emitting area, and the blue light emitting area have the same configuration except that constituent materials of light emitting layers are different from each other.

The organic EL device 1 can be used as an illumination device that generates white light by simultaneously emitting, for example, red light, green light and blue light.

However, applications of the organic EL device 1 are not limited to this illumination device. For example, the organic EL device 1 can be applied to a display device in which a red light emitting area, a green light emitting area and a blue light emitting area form a red subpixel, a green subpixel and a blue subpixel, and these three subpixels constitute one pixel.

FIG. 2 is a plan view of an enlarged part of one unit light emitting area 11.

When viewed in a direction normal to the top surface of the organic EL device 1, the unit light emitting area 11 has a planar square shape, and the length of one side of the square is, for example, about 2 mm.

As shown in FIG. 2, a plurality of recesses 9 having a circular planar shape are provided in the unit light emitting area 11. The diameter φ of the recess 9 is, for example, about 5 μm. The plurality of recesses 9 are disposed regularly in vertical and horizontal directions and form a grid. The density of the recesses 9 is about 70% that is a proportion of the total area of the plurality of recesses 9 with respect to the area of the unit light emitting area 11.

FIG. 3(A) is a cross-sectional view of the organic EL device 1 taken along any plane perpendicular to a top surface of the base material 2 and is a cross-sectional view along the line A-A' in FIG. 2. FIG. 3(B) is a diagram showing a configuration of a second electrode.

As shown in FIG. 3(A), the underlayer 8 is laminated on a top surface 7a of the substrate 7. As the substrate 7, for example, a glass substrate is used. Here, since the organic EL device 1 is a top emission type organic EL device, the substrate 7 does not necessarily have light transmissivity, and a semiconductor substrate, for example, a silicon substrate, may be used.

On a top surface 8a of the underlayer 8, that is, on a top surface 2a of the base material 2, the recesses 9 that open upward are provided. A cross-sectional shape of the recess 9 is an arc shape. That is, an inner surface of the recess 9 forms a part of a spherical surface in three dimensions.

The underlayer 8 is formed of a photosensitive resin, for example, an acrylic, epoxy, or polyimide resin. When a photosensitive resin is used as the material of the underlayer 8, this is suitable for a method of forming the recesses 9 to be described below. However, when a method other than the formation method to be described below is used, a constituent material of the underlayer 8 may not necessarily have photosensitivity.

The constituent material of the underlayer 8 may not be a resin, and an inorganic material may be used. While the base material 2 including the substrate 7 and the underlayer 8 is used in the present embodiment, it is not always necessary to use an underlayer and recesses may be formed in the substrate itself.

The reflective layer 3 is formed on the top surface 8a of the underlayer 8 including an inner surface (surface) of the recess 9. As a constituent material of the reflective layer 3, a highly reflective metal, for example, aluminum, or silver, is suitably used. In the present embodiment, the reflective layer 3 is formed of, for example, an aluminum film having a film thickness of 100 nm.

The colored filling layer 12 is filled inside the recess 9 with the reflective layer 3 therebetween. The colored filling layer 12 is a layer in which a coloring material is mixed into a filling resin and which is colored in a desired color. Here, a pigment matching a luminescent color of a light emitting layer 16 is mixed in. A coloring component of the colored filling layer 12 has a spectrum substantially matching a peak wavelength of one color among light emitting components having peaks of two or more colors.

As the coloring material, a red coloring material may be used in a red unit light emitting area 11R, a green coloring material may be used in a green unit light emitting area 11G, and a blue coloring material may be used in a blue unit light emitting area 11B.

A refractive index of the colored filling layer 12 is the same as the refractive index of a main component material of the light emitting layer 16. In the present embodiment, the refractive index of the colored filling layer 12 is 1.6.

A top surface 12a of the colored filling layer 12 is positioned lower than a plane Q including a top surface 3a of the reflective layer 3. A height from the top surface 12a of the colored filling layer 12 to the top surface 3a of the reflective layer 3 is set as d2. In the present embodiment, the height d2 is set to, for example, 0.1 mm. Here, a height from the lowermost portion 9B of the recess 9 to the top surface 3a of the reflective layer 3 is d1. A specific example of the height d1 will be described below.

The top surface 12a of the colored filling layer 12 is preferably positioned lower than the plane Q including the top surface 3a of the reflective layer 3. However, even if the top surface 12a of the colored filling layer 12 is at a highest position, the height thereof needs to be the same height as the plane Q. In other words, the colored filling layer 12 is formed to protrude upward no higher than the plane Q.

The first electrode 4 is formed over the top surface 12a of the colored filling layer 12 and the top surface 3a of the reflective layer 3. The first electrode 4 has a step at the edge of the recess 9. In the first electrode 4, a portion positioned on the top surface 8a of the underlayer 8 is in contact with a part of the reflective layer 3. At a position inside the recess 9, a bottom surface of the first electrode 4 is in contact with the top surface 12a of the colored filling layer 12. Therefore, the bottom surface of the first electrode 4 is positioned lower than the plane Q including the top surface 3a of the reflective layer 3.

The first electrode 4 is a translucent electrode formed of a laminated film having a transparent conductive film of, for example, indium tin oxide (ITO) or indium zinc oxide (IZO), and a thin metal film and has light transmissivity and light reflectivity. In the present embodiment, the first electrode 4 is formed of, for example, ITO having a film thickness of 120 nm and a thin metal film of Al, Ag, or the like. The first electrode 4 functions as a positive electrode for injecting holes into an organic layer.

The organic layer 5 is laminated along a top surface of the first electrode 4. The organic layer 5 has a step at the edge of the recess 9 in accordance with a shape of the first electrode 4. The organic layer 5 is a laminate formed of an organic material including a hole injecting layer, a hole transporting layer, a light emitting layer, an electron transporting layer and an electron injecting layer. A bottom surface of the organic layer 5 is positioned lower than the plane Q including the top surface 3a of the reflective layer 3. Detailed configurations and functions of the layers forming the organic layer 5 will be described below.

The second electrode 6 is laminated along a top surface of the organic layer 5. The second electrode 6 has a step at the edge of the recess 9 in accordance with a shape of the organic layer 5. The second electrode 6 is a translucent electrode formed of a thin metal film of, for example, silver, or a magnesium silver alloy. That is, the second electrode 6 has both light transmissivity and light reflectivity, and transmits a part of incident light and reflects the rest.

In the second electrode 6, a metal having a low work function is suitably used. For example, Ag, Al, a magnesium alloy (such as MgAg), and an aluminum alloy (such as AlLi, AlCa, and AlMg) may be used. As shown in FIG. 3(B), the second electrode 6 in the present embodiment has a 2-layer laminated film including, for example, an MgAg alloy film (a metal layer) 22 having a film thickness of 1 nm and an Ag film (a metal layer) 26 having a film thickness of 5 nm. The second electrode 6 functions as a negative electrode for injecting electrons into the organic layer 5.

Returning to FIG. 3(A), in the present embodiment, an area interposed between the first electrode 4 and the second electrode 6 forms a microcavity structure. Light emitted from the light emitting layer is multiply reflected between the first electrode 4 and the second electrode 6. In this case, a specific wavelength component of light emitted from the light emitting layer is strengthened. In addition, although not shown in FIG. 3(A), an optical adjustment layer called a cap layer is laminated on a top surface of the second electrode 6.

FIG. 4 shows cross-sectional views of detailed configurations of color unit light emitting areas.

Three unit light emitting areas 11R, 11G, and 11B shown in FIG. 4 have the same basic configuration except that hole injecting layers have different film thicknesses.

As shown in FIG. 4, the organic layer 5 is provided as a layer above the first electrode 4. The organic layer 5 is formed of a laminated film in which the hole injecting layer 14, a hole transporting layer 15, the light emitting layer 16, an electron transporting layer 17, and an electron injecting layer 18 are laminated from the first electrode 4. However, layers other than the light emitting layer 16 may be appropriately inserted as necessary. In addition, the transporting layer and the injecting layer may be integrated as one layer. In the present embodiment, as described above, an organic layer having a 5-layer structure of the hole injecting layer 14, the hole transporting layer 15, the light emitting layer 16, the electron transporting layer 17, and the electron injecting layer 18 is exemplified. In addition, as necessary, a layer for blocking movement of charges to an opposite electrode such as a hole blocking layer and an electron blocking layer may be appropriately added.

The hole injecting layer 14 is a layer having a function of increasing efficiency of hole injection from the first electrode 4 to the light emitting layer 16. As a material of the hole injecting layer 14, for example, benzine, styrylamine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, or derivatives thereof, or heterocyclic conjugated monomers, oligomers or polymers such as a polysilane compound, a vinylcarbazole compound, a thiophene compound or an aniline compound may be used and molybdenum oxide is mixed with such organic materials. A mixing ratio between the organic material and the molybdenum oxide, is for example, about 80% of the organic material to about 20% of molybdenum oxide.

The hole transporting layer 15 is a layer having a function of increasing efficiency of hole transport from the first electrode 4 to the light emitting layer 16. For the hole transporting layer 15, the same organic material as the hole injecting layer 14 is used. Here, the hole injecting layer 14 and the hole transporting layer 15 may be integrated or may be formed as independent layers.

The light emitting layer 16 has a function of recombining holes injected from the first electrode 4 and electrons injected from the second electrode 6 and emitting light using deactivation energy. A material of the light emitting layer 16 includes, for example, a host material and a dopant material. Moreover, an assist material may be included. The host material is included at the highest proportion among constituent materials in the light emitting layer 16. A mixing ratio between the host material and the dopant material is, for example, about 90% of the host material to about 10% of the dopant material. The host material has a function of facilitating film formation of the light emitting layer 16 and maintaining the light emitting layer 16 in a film state. Therefore, as the host material, a stable compound in which hardly any crystallization occurs after film formation and hardly any chemical change occurs is necessary. In addition, the light emitting layer 16 has a function of recombining carriers in host molecules, transferring excitation energy to the dopant material, and causing the dopant material to emit light when an electric field is applied between the first electrode 4 and the second electrode 6. The thickness of the light emitting layer 16 is, for example, about 60 nm.

As a specific material of the light emitting layer 16, a material including a substance having a high luminous efficiency such as a low-molecular-weight fluorescent dye, a fluorescent polymer, and a metal complex may be exemplified. As a material of the light emitting layer 16, for example, anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, or derivatives thereof, tris(8-quinolinolato)aluminum complex, bis(benzoquinolinolato)beryllium complex, tri(dibenzoylmethyl)phenanthroline europium complex, and ditolyl vinylbiphenyl may be exemplified.

The electron transporting layer 17 has a function of increasing efficiency of electron transport from the second electrode 6 to the light emitting layer 16. As a material of the electron transporting layer 17, for example, quinoline, perylene, phenanthroline, bisstyryl, pyrazine, triazole, oxazole, oxadiazole, fluorenone or derivatives thereof, and a metal complex may be used. Specifically, tris(8-hydroxyquinoline)aluminum, anthracene, naphthalene, phenanthrene, pyrene, anthracene, perylene, butadiene, coumarin, acridine, stilbene, 1,10-phenanthroline or derivatives thereof, and a metal complex may be used. The thickness of the electron transporting layer 17 is, for example, about 15 nm.

The electron injecting layer 18 has a function of increasing efficiency of electron injection from the second electrode 6 to the light emitting layer 16. As a material of the electron injecting layer 18, for example, calcium (Ca) metal or lithium fluoride (LiF) may be exemplified. Here, the electron transporting layer 17 and the electron injecting layer 18 may be integrated or may be formed as independent layers. The thickness of the electron injecting layer 18 is, for example, about 0.5 nm.

A microcavity structure 20 has an effect of enhancing light of a specific wavelength using resonance of light generated between the first electrode 4 and the second electrode 6. In the present embodiment, wavelengths of light emitted from the red, green, and blue unit light emitting areas 11R, 11G, and 11B are different from each other. Therefore, an optical path length between the first electrode 4 and the second electrode 6 corresponds to a peak wavelength of an emission spectrum of each color. Optical path lengths are set so that an optical path length of the red unit light emitting area 11R is the longest, an optical path length of the blue unit light emitting area 11B is the shortest, and an optical path length of the green unit light emitting area 11G has an intermediate length.

There are various methods for setting optical path lengths of the microcavity structure 20 of the unit light emitting areas 11R, 11G, and 11B to be different from each other. Here, in consideration of minimizing an influence on a resistance value, a method of setting the thickness of the hole injecting layer 14 to be different is used. When a thickness of the hole injecting layer 14 of the red unit light emitting area 11R is set as tHIL-R, a layer thickness of the hole injecting layer 14 of the green unit light emitting area 11G is set as tHIL-G, and a layer thickness of the hole injecting layer 14 of the blue unit light emitting area 11B is set as tHIL-B, tHIL-R>tHIL-G>tHIL-B is satisfied.

According to the microcavity structure 20, light emitted from the organic layer 5 is repeatedly reflected within a range of a predetermined optical length between the first electrode 4 and the second electrode 6, light of a specific wavelength corresponding to the optical path length is resonated and enhanced, but light of a wavelength that does not correspond to the optical path length is weakened. As a result, a spectrum of light extracted to the outside is sharp and has a high intensity, and a luminance and a color purity become higher.

As a constituent material of the light emitting layer 16, a light emitting material that emits red light may be used in the red unit light emitting area 11R, a light emitting material that emits green light may be used in the green unit light emitting area 11G, and a light emitting material that emits blue light may be used in the blue unit light emitting area 11B. In the present embodiment, in all of the unit light emitting areas, a bipolar material is used as the host material.

As the dopant material, a phosphorescent material is used for the red unit light emitting area 11R and the green unit light emitting area 11G, and a fluorescent material is used for the blue unit light emitting area 11B. The thickness of the light emitting layer 16 is, for example, about 60 nm, in the red unit light emitting area 11R and the green unit light emitting area 11G, and is, for example, about 35 nm, in the blue unit light emitting area 11B.

Alternatively, the same light emitting material that emits white light may be used in all of the red unit light emitting area 11R, the green unit light emitting area 11G, and the blue unit light emitting area 11B. In this case also, light of a different wavelength is resonated and amplified in each of the unit light emitting areas 11R, 11G, and 11B. As a result, red light is emitted from the red unit light emitting area 11R, green light is emitted from the green unit light emitting area 11G, and blue light is emitted from the blue unit light emitting area 11B.

A cap layer 21 is laminated on the top surface of the second electrode 6. The cap layer 21 functions as a protective layer for protecting the second electrode 6 and functions as an optical adjustment layer.

Specific configuration examples of the organic EL device 1 are shown, for example, in [Table 1].

TABLE 1

|  | Red | Green | Blue |
|---|---|---|---|
| Positive electrode: ITO | 120 nm | 120 nm | 120 nm |
| Hole injecting layer (HIL) Organic HTL material (80%): MoOx (20%) | 130 m | 70 nm | 35 nm |
| Hole transporting layer; organic ETL material | 10 nm | 10 nm | 10 nm |
| Light emitting layer (EML) | H (90%): d (10%) 60 nm H: bipolar material d: phosphorescent material | H (90%): d(10%) 60 nm H: bipolar material d: phosphorescent material | H (90%): d(10%) 35 nm H: bipolar material d: fluorescent material |
| Electron transporting layer: organic ETL material | 15 nm | 15 nm | 15 nm |
| Electron injecting layer: LiF | 0.5 nm | 0.5 nm | 0.5 nm |
| Negative electrode (translucent electrode) | MgAg 1 nm/Ag | MgAg 1 nm/Ag | MgAg 1 nm/Ag |
| Cap layer | 78 nm | 78 nm | 78 nm |

A process of manufacturing the organic EL device 1 having the above configuration will be described below with reference to FIG. 5 to FIG. 8.

First, as shown in FIG. 5(A), a positive photosensitive resin material is applied to the top surface 7a of the substrate 7 to form a resin layer 23.

Next, as shown in FIG. 5(B), the resin layer 23 is exposed through a photomask 24.

In this case, like a gray tone mask, the photomask 24 having a predetermined light transmission amount distribution, specifically, the photomask 24 whose light transmission amount near the center of a circular pattern is large and whose light transmission amount reduces toward the peripheral portions is used. Accordingly, in the resin layer 23, an exposure amount near the center of a circular pattern is large and an exposure amount reduces toward the peripheral portions.

Next, as shown in FIG. 5(C), a predetermined developing solution is used to develop the resin layer 23. In this case, according to differences in the exposure amount of the resin layer 23, a film reduction amount of the resin layer 23 is large near the center of a circular pattern and reduces toward the peripheral portions. In this manner, the recesses 9 whose cross-sectional shapes are arc shapes are formed in the resin layer 23 and the underlayer 8 is formed.

Next, as shown in FIG. 5(D), a metal such as aluminum is deposited on the entire surface of the underlayer 8 and the reflective layer 3 is formed.

Next, as a method of forming the colored filling layer 12, three methods may be exemplified.

Methods of forming the colored filling layer 12 will be described below.

The first filling layer formation method is as follows.

First, as shown in FIG. 6(A), an acrylic, epoxy, or polyimide resin film 25 is formed on the entire surface of the reflective layer 3. As a method of forming the resin film 25, for example, a spin coating method, a bar coating method or the like is used, and a liquid resin material including a coloring material is applied onto the reflective layer 3. In this case, the film thickness of the resin film 25 is set so that the resin film 25 fills the recess 9 and also covers a flat portion of the reflective layer 3.

Next, as shown in FIG. 6(B), the entire surface of the resin film 25 is etched back using, for example, plasma ashing (dry ashing). In this case, an amount of etch back is adjusted so that a top surface 25a of the resin film 25 is positioned lower than the plane Q including the top surface 3a of the reflective layer 3. Accordingly, the colored filling layer 12 is formed.

Next, as shown in FIG. 6(C), on the top surface 3a of the reflective layer 3 and the top surface 12a of the colored filling layer 12, the first electrode 4, the organic layer 5, and the second electrode 6 are sequentially formed. The first electrode 4, the organic layer 5, and the second electrode 6 are formed according to a known process. For example, a pattern may be formed according to a vacuum deposition method using a shadow mask. The method is not limited thereto, and a spray method, an ink jet method, a printing method, a laser transfer method, and the like can be used.

The second filling layer formation method is as follows.

As shown in FIG. 7(A), the acrylic, epoxy, or polyimide resin film 25 is formed on the entire surface of the reflective layer 3. This process is the same as in the first filling layer formation method shown in FIG. 6(A).

Next, as shown in FIG. 7(B), a squeegee 27 is used to planarize the entire surface of the resin film 25. In this case, the squeegee 27 is moved along the top surface 3a of the reflective layer 3 so that the top surface 25a of the resin film 25 after the squeegee 27 has passed is on the same plane as the plane Q including the top surface 3a of the reflective layer 3.

Next, as shown in FIG. 7(C), a base material in which the resin film 25 remains in the recess 9 is calcined.

A volume of the resin film 25 is reduced due to calcination. As a result, the top surface 25a of the resin film 25 is positioned lower than the plane Q including the top surface 3a of the reflective layer 3. Accordingly, the colored filling layer 12 is formed.

Next, as shown in FIG. 7(D), on the top surface 3a of the reflective layer 3 and the top surface 12a of the colored filling layer 12, the first electrode 4, the organic layer 5, and the second electrode 6 are sequentially formed. This process is the same as in the first filling layer formation method shown in FIG. 6(C).

The third filling layer formation method is as follows.

As shown in FIG. 8(A), the acrylic, epoxy, or polyimide resin film 25 is laminated on a surface of the reflective layer 3 corresponding to the inside of the recess 9. As a method of forming the resin film 25, a droplet resin material is applied onto the reflective layer 3 using, for example, an inkjet method. In this case, an amount of a resin material discharged from an inkjet head 29 is adjusted so that the top surface 25a of the resin film 25 is positioned lower than the plane Q including the top surface 3a of the reflective layer 3. Accordingly, the colored filling layer 12 is formed.

Next, as shown in FIG. 8(B), on the top surface 3a of the reflective layer 3 and the top surface 12a of the colored filling layer 12, the first electrode 4, the organic layer 5, and the second electrode 6 are sequentially formed. This process is the same as in the first filling layer formation method shown in FIG. 6(C).

The organic EL device 1 of the present embodiment is completed according to the above process.

Features of one aspect of the present invention are that [1] a light extraction efficiency is improved according to the above-described recess structure and [2] dye improvement according to the colored filling layer 12 is devised.

Regarding [1]

FIG. 9(A) is a cross-sectional view showing an organic EL device 101 having no recess structure in the related art.

The organic EL device 101 has a configuration in which a reflective layer 103, a first electrode 104, an organic layer 105, and a second electrode 106 are sequentially laminated on a substrate 102. In the organic EL device 101, light emitted from a light emitting layer in the organic layer 105 is uniformly emitted in all directions, and travels inside while being refracted at the interface between layers having different refractive indexes. Light having traveled toward the substrate 102 is reflected at the reflective layer 103.

Since there is a refractive index difference at the interface between the second electrode 106 and an external space (air), light incident at a small angle of incidence with respect to the interface is emitted to the external space, and light incident at a large angle of incidence is reflected at the interface and travels inside again. For example, light L1 emitted from an arbitrary light-emitting point M in the organic layer 105 in a direction close to horizontal is refracted at the interface between layers, and hardly any thereof is emitted to the external space even if an angle slightly changes.

In a path when light travels in the organic EL device 101, at the interface between the second electrode 106 and the external space (air), a loss due to light reflection does not occur. On the other hand, at the interface between the first electrode 104 and the reflective layer 103, in general, since a reflectance of a metal of the reflective layer 103 is not 100%, a loss due to light reflection occurs. Further, some light is absorbed by each film while travelling in the organic EL device 101. Therefore, light attenuates while traveling in the organic EL device 101. In general, a refractive index of the organic layer 105 is about 1.8. In this case, in light emitted from the light emitting layer, a proportion of light extracted to the external space is about 20%. As a result, the organic EL device 101 of the related art has a problem of low light use efficiency.

On the other hand, in the organic EL device 1 of the present embodiment, as shown in FIG. 9(B), since the reflective layer 3 is curved along the recess 9, light reflected at the reflective layer 3 has a travelling direction that is changed and travels in the organic EL device 1. In this case, even if light originally has a large angle of incidence with respect to the interface between the second electrode 6 and the external space (air), light is reflected at the reflective layer 3 and thus has an angle of incidence that is smaller than a critical angle at the interface between the second electrode 6 and the external space, and the light is extracted to the external space.

In particular, in the present embodiment, as described above, the top surface 12a of the colored filling layer 12 is positioned lower than the plane Q including the top surface 3a of the reflective layer 3 and a bottom surface 5b of the organic layer 5 is positioned lower than the plane Q. That is, the reflective layer 3 is provided on the side (in the horizontal direction in FIG. 9(B)) of the organic layer 5 inside the recess 9. Therefore, for example, light L1 emitted from an arbitrary light-emitting point M in the organic layer 5 in a direction close to horizontal is reflected at the reflective layer 3 and has an angle of the travelling direction that is changed.

As a result, unlike the organic EL device 101 of the related art shown in FIG. 9(A), light L1 emitted from the light-emitting point M in a direction close to horizontal is reflected at the reflective layer 3, and then can be extracted to the external space when the light L1 enters at an angle of incidence smaller than a critical angle at the interface between the second electrode 6 and the external space. In this manner, it is possible to provide the organic EL device 1 having excellent light use efficiency.

Moreover, in the present embodiment, since the top surface 12a of the colored filling layer 12 is positioned lower than the plane Q and the bottom surface 5b of the organic layer 5 is positioned lower than the plane Q, light emitted substantially horizontally from the light-emitting point M in the organic layer 5 can also enter the reflective layer 3. However, if the top surface 12a of the colored filling layer 12 is on the same plane as the plane Q, the bottom surface 5b of the organic layer 5 is positioned higher than the plane Q. In this case, since the reflective layer 3 is not provided on the side of the organic layer 5 positioned inside the recess 9, light emitted substantially horizontally from the light-emitting point M in the organic layer 5 does not enter the reflective layer 3.

Here, compared to the organic EL device 101 of the related art, a proportion of light emitted from the light-emitting point M in the organic layer 5 within a predetermined angle range close to the side that enters the reflective layer 3 sufficiently increases. Therefore, in such a configuration, it is possible to provide the organic EL device 1 having excellent light use efficiency.

Furthermore, in addition to the light extraction structure described above, as a feature for the organic EL device 1 in the present embodiment, the second electrode 6 close to a transparent electrode is included. In a configuration of the related art, when a light reflectance of the second electrode is high, light that should be extracted to the outside is reflected at the second electrode and enters the recess structure again.

Regarding [2]

FIG. 10(A) is a graph showing an emission spectrum of a green light emitting material. FIG. 10(B) is a graph showing a transmission spectrum of a color filter. FIG. 11 is a graph showing an emission spectrum of a green light emitting material after passing through a filling layer.

As shown in FIG. 10(A), a light emitting material used in the organic EL device has a broad emission spectrum. Therefore, a color purity is low even if green light is emitted, and color reproducibility of a display is deteriorated.

Therefore, as shown in FIG. 10(B), when light is caused to pass through a color filter as used in a liquid crystal display, it is possible to improve a color purity. In the present embodiment, an absorption wavelength range of the colored filling layer 12 overlaps a part of an emission spectrum of light emitted from the light emitting layer 16. Therefore, as exemplified in FIG. 11, in an originally broad green emission spectrum, when light passes through a color filter, a part of a light component away from a peak wavelength is cut to form a sharp profile, and a color purity is improved.

In order for the organic EL device of the related art to obtain the above effect, a color filter is provided on a light emitting side of the organic layer.

In a configuration of the present embodiment, when a resin is filled into a recess structure, if a coloring material is mixed into a filling resin material, since the colored filling layer 12 can be obtained, there is no need to separately provide a color filter.

FIG. 12(A) is a diagram for describing a light extraction efficiency in the organic EL device of the first embodiment. FIG. 12(B) is a diagram for describing a light extraction efficiency in the organic EL device of the related art.

First, a light extraction efficiency in the organic EL device of the related art will be described.

As shown in FIG. 12(B), in a configuration of the organic EL device of the related art, for example, light emitted from an arbitrary light-emitting point M in the organic layer 105 to the outside includes a light component directly emitted from a top surface of the organic layer 105 in the forward direction and a light component that is reflected at the reflective layer 103 and is then emitted in the forward direction.

A condition in which a light emitting component can be emitted to the outside includes that ranges are $0° \leq \theta_A \leq 33°$ and $147° \leq \theta_B \leq 180°$ when a light exit angle $\theta$ in a direction normal to the organic layer 105 is 0°.

The exit angle $\theta_A$ and the exit angle $\theta_B$ are determined by total reflection conditions. Since the refractive index of the organic layer 105 is about 1.8, the exit angle $|\theta_A|$ and the exit angle $|\theta_B|$ are about 33°, and a light intensity is 8.5% with respect to total emitted light. A light component directly emitted from the organic layer 105 in the forward direction and a light component that is reflected at the reflective layer 3 and is emitted in the forward direction have the same light intensity, which is about 50% of the total intensity.

Next, a light extraction efficiency of the organic EL device of the present embodiment will be described.

As shown in FIG. 12(A), in the organic EL device of the present embodiment, due to the effect of the recess structure, an angle of light emitted in the forward direction is greater. Here, the exit angles $|\theta_A|$ and $|\theta_B|=33°$, and the exit angles $|\theta_C|$ and $|\theta_D|=60°$.

In light emitted in the forward direction:

(1) For a light component directly emitted from the light-emitting point M in the forward direction: an exit angle range is $0° \leq |\theta| \leq 33°$, and a light intensity is 8.5% with respect to the total light intensity;

(2) For a light component that travels from the light-emitting point M in the forward direction, is totally reflected at the second electrode 6, and is then emitted in the forward direction at an angle that is changed due to reflection at the reflective layer 3 in the recess structure: an exit angle component has $33° \leq |\theta| \leq 60°$ and a light intensity is 16.5% with respect to the total light intensity; and (3) For a light component that travels from the light-emitting point M toward a recess structure opposite to the forward direction, and is emitted in the forward direction at an angle that is changed due to reflection at the reflective layer 3: an exit angle range is 60°≤|θ|≤180° and a light intensity is 25% with respect to the total light intensity.

Among the above light components (1), (2), and (3), the light components that have passed through the colored filling layer 12 are (2) and (3), which have a light intensity of 41.5% with respect to the total light intensity. The total light extraction amount is 50% in (1) to (3). Therefore, a light component of 82% of the total light extraction amount is light that has passed through the colored filling layer 12.

In this manner, since most of the light from the light emitting layer 16 is reflected at the reflective layer 3 in the recess structure and emitted in the forward direction, when the colored filling layer 12 in the recess structure is colored in an arbitrary color, it is possible to effectively improve a color purity of light emitted.

In order to verify an effect of the organic EL device 1 of the present embodiment, the inventors prepared the following three elements and compared effects thereof. The three prepared elements included a back emission type green light emitting element as Comparative Example 1, a green light emitting element including a transparent filling layer in a recess structure as Comparative Example 2, and a green light emitting element including a green colored filling layer in a recess structure of the present embodiment.

Here, the total luminous flux of the above three elements was measured using an integrating sphere. Based on the element of Comparative Example 1, relative intensities of luminances were compared.

FIG. 13 is a graph showing emission spectrum characteristics of organic EL elements according to Comparative Example 1, Comparative Example 2, and the present embodiment, and characteristics are compared and summarized in Table 2.

TABLE 2

|  | Peak intensity | Chromaticity | |
|---|---|---|---|
|  |  | x | y |
| Comparative Example 1 | 1.0 | 0.369 | 0.614 |
| Comparative Example 2 | 1.5 | 0.369 | 0.614 |
| First embodiment | 1.4 | 0.326 | 0.655 |

As shown in FIG. 13 and Table 2, it can be understood that a light intensity is increased due to the provision of a recess structure in the organic EL elements of Comparative Example 2 and the first embodiment. In addition, it was found that the organic EL element of the present embodiment has a sharper emission spectrum and a higher color purity than those of Comparative Example 2. Based on such results, it was found that it is possible to improve both a color intensity and a color purity according to the configuration in which the colored filling layer 12 is provided in the recess structure. In addition, in the configuration of the present embodiment, since it is sufficient to prepare the colored filling layer at the same time as when the recess structure is provided, there is no need to separately provide the color filter layer, and it is possible to save the time and effort of the manufacturing process.

Here, when a color density or a spectrum of the colored filling layer 12 is changed, it is possible to further increase a color purity and also perform adjustment to an arbitrary chromaticity. Moreover, while the green light emitting element has been exemplified in the above-described present embodiment, the same effect can be exhibited in the blue and red light emitting elements.

Second Embodiment

Next, a configuration of an organic EL device according to a second embodiment of the present invention will be described.

The basic configuration of the organic EL device according to the present embodiment to be described below is substantially the same as that of the first embodiment except that a colored filling layer has a different refractive index. Accordingly, in the following description, different parts and effects will be described in detail, but common parts will not be described. In addition, in the drawings used for description, the same reference numerals denote elements the same as in FIG. 1 to FIG. 13.

FIG. 14 is a diagram for describing a configuration and an operation of the organic EL device according to the second embodiment.

An organic EL device 10 of the present embodiment shown in FIG. 14 includes the colored filling layer 22 having a refractive index close to refractive indexes of the first electrode 4 and the organic layer 5. In the previous embodiment, a refractive index of the colored filling layer is 1.8. On the other hand, a refractive index of the colored filling layer 22 in the present embodiment is 2.0. Here, a refractive index of the organic layer 5 is 1.8, and a refractive index of the first electrode 4 made of ITO is 1.9 to 2.0.

The refractive index of the colored filling layer 22 can be adjusted by mixing an olefin resin having a refractive index of 1.65 with zirconia nanoparticles. Specifically, the refractive index is adjusted according to a mixing ratio between zirconia nanoparticles and the olefin resin. The zirconia nanoparticles correspond to oxide nanoparticles in one aspect of the present invention.

In this manner, when the refractive index of the colored filling layer 22 is set to be close to the refractive indexes of the first electrode 4 and the organic layer 5, a total reflection condition at an interface between the colored filling layer 22 and the first electrode 4 is not satisfied and light easily enters the recess structure.

In the previous embodiment, among the light emitting components from the organic layer 5, except for a light component directly extracted in the forward direction, the remaining component is totally reflected at an interface between the second electrode 6 and the organic layer 5 and travels toward the first electrode 4.

Since a refractive index of the first electrode 4 is 1.9 to 2.0 and a refractive index of the colored filling layer 22 is 1.8, total reflection may also occur at an interface between the first electrode 4 and the colored filling layer 22 and some of the light does not enter the recess structure, and does not pass through the colored filling layer 22. As a result, it is not possible to extract light that is repeatedly totally reflected between the colored filling layer 22 and the second electrode 6 to the outside.

Therefore, in order for as much light as possible to be introduced into the recess structure and reflected at the reflective layer 3, it is desirable that the refractive indexes of the organic layer 5, the first electrode 4 and the colored filling layer 22 be substantially the same. When an amount of light introduced into the recess structure increases, since the light can be reflected at the reflective layer 3 and extracted to the outside, it is possible to improve a light extraction efficiency. In addition, since an amount of a light component that has passed through the colored filling layer 22 also increases, the effect of the colored filling layer 22 can be strengthened and the color purity can be improved.

In order to verify an effect of the organic EL device of the present embodiment, the inventors prepared the following three elements including colored filling layers having different refractive indexes and compared effects thereof. The three prepared elements included an element including a colored filling layer having a refractive index of 1.6 according to the first embodiment as a comparative example, an element including a colored filling layer having a refractive index of 1.8 as Example (1), and an element including a colored filling layer having a refractive index of 2.0 as Example (2). The element prepared as the comparative example is an element corresponding to the configuration of the first embodiment. Examples (1) and (2) are elements corresponding to the configuration of the second embodiment. In addition, based on the element of the first embodiment as the comparative example, relative intensities of light luminances of the elements were compared.

TABLE 3

|  | Comparative Example | Element of Present Example (1) | Element of Present Example (2) |
|---|---|---|---|
| Refractive index of organic layer | 1.8 | 1.8 | 1.8 |
| Refractive index of transparent electrode | 2.0 | 2.0 | 2.0 |
| Refractive index of filling layer | 1.6 | 1.8 | 2.0 |
| Extractable component proportion with respect to total light intensity A | 50% | 73% | 86% |
| Proportion of component entering recess with respect to total light intensity B | 41% | 62% | 78% |
| B/A | 80% | 85% | 91% |
| Light emission intensity with respect to Example 1 | 100 | 125 | 168 |
| Chromaticity      x | 0.324 | 0.321 | 0.320 |
|                   y | 0.655 | 0.658 | 0.660 |

As shown in Table 3, in the organic EL element of the comparative example including the colored filling layer having a refractive index of 1.6, a proportion of a light extractable component was 50% with respect to the total light intensity. In addition, a proportion of a light component entering the recess structure was 41% with respect to the total light intensity. That is, a proportion of light entering the recess structure from the light extractable component was 80%.

On the other hand, in the element of Example (1) including the colored filling layer 22 having a refractive index of 1.8, a proportion of light entering the recess structure from the light extractable component with respect to the total light intensity was increased to 85%. In addition, in the element of Example (2) including the colored filling layer 22 having a refractive index of 2.0, a proportion thereof was 91%.

As described above, it was found that, when the refractive index of the colored filling layer 22 was closer to the refractive indexes of the first electrode 4 and the organic layer 5, reflection at an interface between the first electrode 4 and the colored filling layer 22 was prevented, an amount of light entering the recess structure increased, and an amount of the light extractable component increased. Accordingly, the light emission intensity also increased.

In addition, it was found that the higher the refractive index of the colored filling layer 22, the higher the y value of chromaticity coordinates indicating a green color, and chromaticity was improved. This is because, since a proportion (a numerical value of B/A in Table 3) of light entering the recess structure from light that can be extracted to the outside increases, a coloring effect due to the colored filling layer 22 becomes stronger. That is, this is because an amount of a light component coloring the colored filling layer 22 increases.

Third Embodiment

Next, an organic EL device according to a third embodiment of the present invention will be described.

The basic configuration of the organic EL device according to the present embodiment to be described below is substantially the same as that of the first embodiment except that a color filter layer is further included. Accordingly, in the following description, different parts and effects will be described in detail, but common parts will not be described. In addition, in the drawings used for description, the same reference numerals denote elements the same as in FIG. 1 to FIG. 13.

FIG. 15 is a diagram for describing a configuration and an operation of the organic EL device according to the third embodiment.

An organic EL device 30 of the present embodiment shown in FIG. 15 has a configuration in which a green color filter layer CF is laminated on the second electrode 6. Here, the sheet-like color filter layer CF is adhered to a surface of the second electrode 6. In addition to the above-described method, as a method of laminating a color filter layer CF, (1) a method in which a protective layer is provided on the second electrode 6, and a color filter material is then applied onto the protective layer to form a film, (2) a method in which a color filter material is deposited on a surface of the second electrode 6 to form a film, and (3) a method in which a color filter layer CF is provided in advance on an opposite side of a base material (not shown), and is attached to the base material 2, and thus the color filter layer CF is laminated on the second electrode 6 and the like are conceivable. Note that the present invention is not limited to the above methods.

According to the configuration of the present embodiment, when the color filter layer CF having the same color as the luminescent color of the light emitting layer 16 is also provided for a light component directly emitted from an arbitrary light-emitting point M in the light emitting layer 16 in the forward direction, it is possible to increase a color purity of light. When there is a small amount of a light component directly emitted from the light-emitting point M in the forward direction as described above, such a structure may be used when a high color purity is required.

Since the color filter layer CF converts a color for a small amount of light emitted in the forward direction, it may have a thinner film thickness than that of a color filter layer CF used in a liquid crystal display or the like. The color filter layer CF of the present embodiment has a film thickness of 500 nm.

In order to verify an effect of the organic EL device 30 of the present embodiment, the inventors prepared the following three elements and compared effects thereof. The prepared elements included an element (having no coloring function) having a back emission structure of the related art as Comparative Example 1, an organic EL element (including only a colored filling layer) in the first embodiment as Comparative Example 2, and an organic EL element (a colored filling layer+a color filter layer CF) in the third embodiment. Table 4 shows chromaticities of the organic EL elements.

TABLE 4

|  | x | y |
| --- | --- | --- |
| Comparative Example 1 | 0.369 | 0.614 |
| Comparative Example 2 | 0.324 | 0.655 |
| Third embodiment | 0.315 | 0.663 |

As shown in Table 4, it can be clearly understood that the configuration of the present embodiment including both a colored filling layer and a color filter layer CF has a higher y value of chromaticity coordinates indicating the green color than in the configuration of Comparative Example 2 including only a colored filling layer. Accordingly, it can be understood that, when the configuration further including a color filter layer CF is used, it is possible to effectively improve chromaticity.

Fourth Embodiment

Next, an organic EL device according to a fourth embodiment of the present invention will be described.

The basic configuration of the organic EL device according to the present embodiment to be described below is substantially the same as that of the first embodiment except that a white light emitting layer is included. Accordingly, in the following description, different parts and effects will be described in detail, but common parts will not be described. In addition, in the drawings used for description, the same reference numerals denote elements the same as in FIG. 1 to FIG. 13.

FIG. 16 is a diagram showing a configuration of the organic EL device according to the fourth embodiment.

While the organic EL device of the first embodiment described above includes a green light emitting organic layer, an organic EL device 40 of the present embodiment shown in FIG. 16 includes a white light emitting organic layer 45. In addition, a color filter layer CF is laminated on the second electrode 6. Here, the green colored filling layer 12 is disposed in the recess structure, which is the same as in the above.

The white light emitting organic layer 45 includes a blue light emitting material, a green light emitting material and a red light emitting material.

In the present embodiment, since the organic layer 45 emits white light, a color of the color filter layer CF is selected according to a color of the colored filling layer 12. As described above, a green color filter layer CF is used in accordance with the green colored filling layer 12.

Also, a coloring component of the colored filling layer 12 may have an absorption spectrum substantially matching a peak wavelength of one color among light emitting components having peak wavelengths of two or more colors in the organic layer 45.

Next, a configuration of a white light emitting organic EL element will be described in detail.

The configuration of the white light emitting organic layer 45 in the present embodiment includes a first light emitting unit (EMU1) 19B in which blue light is emitted and a second light emitting unit (EMU2) 19RG in which green light and red light are emitted.

FIG. 17(A) is a diagram showing a configuration of a blue light emitting unit. FIG. 17(B) is a diagram showing a configuration of a green and red light emitting unit. In addition, FIG. 17(C) is a diagram showing a configuration of a white light emitting organic EL element.

As shown in FIGS. 17(A) and 17(B), in the present embodiment, a light emitting unit (EMU) 19 has a structure in which a hole injecting layer (HIL) 14 having a film thickness of 40 nm, a hole transporting layer (HTL) 15 having a film thickness of 30 nm, a light emitting layer (EML) 16 having a film thickness of 60 nm, and an electron transporting layer (ETL) 17 having a film thickness of 15 nm are laminated.

The present embodiment includes the first light emitting unit (EMU1) 19B including the blue light emitting layer 16B doped with a blue light emitting material as shown in FIG. 17(A) and the second light emitting unit (EMU2) 19RG including the green light emitting layer 16G doped with a green light emitting material and the red light emitting layer 16R doped with a red light emitting material as shown in FIG. 17(B).

Here, in the second light emitting unit 19RG, the green light emitting layer 16G and the red light emitting layer 16R are laminated in that order.

An organic EL element including a white light emitting organic layer 35 in the third embodiment shown in FIG. 17(C) includes both the blue light emitting unit and the green and red light emitting unit described above, and thus emits white light.

The organic EL element of the present embodiment has a configuration in which the first light emitting unit 19B, a lithium (Li) layer, a copper phthalocyanine (CuPC) complex layer, the second light emitting unit 19RG, a lithium fluoride (LiF) layer and the second electrode 6 are laminated on the first electrode 4 in that order. Here, a charge generating layer 13 includes a lithium (Li) layer having a film thickness of 1 nm and a copper phthalocyanine (CuPC) complex layer having a film thickness of 5 nm. The two layers of the first light emitting unit 19B and the second light emitting unit 19RG are laminated with the charge generating layer 13 therebetween as an intermediate layer.

The first electrode 4 is made of ITO having a film thickness of 120 nm. The lithium fluoride (LiF) layer having a film thickness of 0.5 nm functions as the electron injecting layer 18.

FIG. 18 is a graph showing an emission spectrum of a white light emitting element having a back emission structure. Here, the device structure shown in FIG. 17(C) is used and an Al film of the second electrode 6 is set to have a thickness of 100 nm. A green light emitting material is mixed into a colored filling layer in the recess structure. In the present embodiment, since an RGB light emitting material is mixed in in one light emitting layer, it is not possible to obtain a microcavity effect as in the above-described embodiment. Therefore, in the present embodiment, an emission spectrum similar to that of the back emission structure of the related art is a basic characteristic.

In order to verify an effect of the organic EL device 40 of the present embodiment, the inventors prepared the following three white light emitting organic EL elements and compared effects thereof. The three prepared elements included an organic EL element having a back emission structure as Comparative Example 1, an organic EL element (transparent filling layer+white light emitting element) having a recess structure as Comparative Example 2, and an organic EL element (green colored filling layer+white light emitting element) of the fourth embodiment.

FIG. 19 is a graph showing emission spectrums of the above three organic EL elements.

TABLE 5

| | Chromaticity | |
| --- | --- | --- |
| | x | y |
| Comparative Example 1 (chromaticity of white) | 0.355 | 0.354 |
| Comparative Example 2 (chromaticity of green) | 0.369 | 0.614 |
| Fourth embodiment (chromaticity of green) | 0.304 | 0.544 |

As shown in FIG. 19, in the back emission structure of Comparative Example 1, white light in which peaks of RGB light emitting materials were expressed was emitted. On the other hand, the organic EL element of Comparative Example 2 having the recess structure included a white light emitting organic layer and a transparent filling layer filled inside the recess structure, and had peaks of RGB light emitting materials that were higher than those of Comparative Example 1. White light having a high luminance was emitted.

On the other hand, the organic EL element of the present embodiment included a white light emitting organic layer and a green colored filling layer filled inside the recess structure, and substantially a green emission spectrum was obtained. As shown in Table 5, while a luminescent chromaticity of the present embodiment was lower than a green chromaticity of Comparative Example 2, if the color filter layer CF was added, it was possible to increase the chromaticity. While an element based on green light emission is produced in the configuration of the present embodiment, the same effects can be obtained for a red light emitting or blue light emitting element.

Accordingly, when a recess structure is produced for each subpixel of a display and each color filter layer CF of RGB is provided for each subpixel, it is possible to produce a color display.

In general, a color display is produced by attaching a color filter substrate that is separately prepared to a white light emitting substrate. However, according to the present embodiment, it is possible to easily produce a color display without separately preparing a color filter substrate.

Fifth Embodiment

Next, an organic EL device according to a fifth embodiment of the present invention will be described.

The basic configuration of the organic EL device according to the present embodiment to be described below is substantially the same as that of the fourth embodiment except that a color filter layer CF is laminated on a white light emitting organic EL element.

Accordingly, in the following description, different parts and effects will be described in detail, but common parts will not be described. In addition, in the drawings used for description, the same reference numerals denote elements the same as in FIG. 1 to FIG. 13.

FIG. 20 is a diagram showing a configuration of the organic EL device according to the fifth embodiment.

The organic EL device of the present embodiment has a configuration in which the colored filling layer 12 is filled inside the recess structure with the reflective layer 3 therebetween, and the first electrode 4, the white light emitting organic layer 45, the second electrode 6, and a color filter layer CF are sequentially laminated on the colored filling layer 12. The color filter layer CF has a green color in accordance with a green coloring material included in the colored filling layer 12.

Here, the sheet-like color filter layer CF is adhered to and provided on a surface of the second electrode 6. As a method of laminating the color filter layer CF, the same method as in the third embodiment can be used.

According to the configuration of the present embodiment, it is possible to convert white light into green light by providing the color filter layer CF having the same color as the colored filling layer 12 for white light directly emitted from an arbitrary light-emitting point N in the white light emitting organic layer 45 in the forward direction. When there is a small amount of a white light component directly emitted from the light-emitting point N in the forward direction as described above, such a structure may be used when a high color purity is required.

In order to verify an effect of an organic EL device 50 of the present embodiment, the inventors prepared the following four organic EL elements and compared luminescent chromaticities thereof. The four prepared elements included an organic EL element having a back emission structure as Comparative Example 1, the organic EL element of the first embodiment as Comparative Example 2, the organic EL element of the fourth embodiment as Comparative Example 3, and the organic EL element of the present embodiment. Here, Comparative Example 1 is a white light emitting element, and Comparative Example 2, Comparative Example 3 and the present embodiment are green light emitting elements.

Table 6 shows chromaticity coordinates of the organic EL elements of Comparative Examples 1 to 3 and the organic EL element of the present embodiment.

TABLE 6

| | Chromaticity | |
| --- | --- | --- |
| | x | y |
| Comparative Example 1 (chromaticity of white) | 0.355 | 0.354 |
| Comparative Example 2 (chromaticity of green) | 0.369 | 0.614 |
| Comparative Example 3 (chromaticity of green) | 0.304 | 0.544 |
| Fifth embodiment (chromaticity of green) | 0.285 | 0.621 |

As shown in Table 6, in the organic EL element of the present embodiment, it was found that the y value of chromaticity coordinates indicating a green color (luminance) had the highest numerical value and the x value indicating a red color had the lowest numerical value, and a chromaticity improvement effect was strong. In the present embodiment, from light emitted from the organic layer 45, light that had travelled inside the recess structure and passed through the colored filling layer 12 was emitted in the forward direction as green light. On the other hand, white light directly emitted from the organic layer 45 in the forward direction was converted into green light by the color filter layer CF. That is, from white light directly emitted in the forward direction, a red light component and a blue light component other than a green light component were substantially cut in the green color filter layer CF. Therefore, the x value indicating a red color had a low numerical value. Therefore, according to the configuration of the present embodiment, it is possible to emit green light having a high color purity.

It should be noted that, while exemplary embodiments according to the present invention have been described above with reference to the appended drawings, the present invention is not limited to these embodiments. It can be clearly and easily understood by those skilled in the art that various changes or modifications can be made within the spirit and scope of the invention defined by the appended claims, and these will be construed as being included in the technical scope of the invention. Configurations of the embodiments may be appropriately combined.

Note that the technical scope of the present invention is not limited to the above embodiments, and various modifications can be made without departing from the spirit of the invention.

In addition, specific configurations such as shapes, sizes, the numbers thereof, dispositions, constituent materials, and formation processes of elements of the organic EL device are not limited to those in the above embodiments, and can be appropriately changed.

In addition, one aspect of the organic EL device of the present invention can be applied to an illumination device and the like in addition to a display device. For example, when one aspect of the present invention is applied to an illumination device configured to generate white light, it is not necessary to include a plurality of unit light emitting areas which are divided from each other and have different luminescent colors as exemplified in the above embodiment. Specifically, for example, one light emitting layer may be doped with 3 kinds of dopant dye which are red, green, and blue, a laminated structure of a blue hole transporting light emitting layer, a green electron transport light emitting layer and a red electron transporting light emitting layer may be used, and a laminated structure of a blue electron transporting light emitting layer, a green electron transport light emitting layer and a red electron transporting light emitting layer may be used.

INDUSTRIAL APPLICABILITY

Some aspects of the present invention can be used for any electronic product including a light emitting unit such as a display device or an illumination device.

DESCRIPTION OF THE REFERENCE SYMBOLS

2 Base material
2a Top surface
3 Reflective layer
4 First electrode
5, 35, 45 Organic layer
5b Bottom surface
6 Second electrode
9 Recess
Q Plane
12 Colored filling layer (filling layer)
13 Charge generating layer
14 Hole injecting layer (HIL)
15 Hole transporting layer (HTL)
16 Light emitting layer (EML)
17 Electron transporting layer (ETL)
CF Color filter layer

The invention claimed is:
1. An organic electroluminescence device comprising:
a base material having a top surface on which a recess is provided;
a reflective layer provided along at least a surface of the recess;
a filling layer filled inside the recess via the reflective layer, the filling layer having light transmissivity;
a first electrode provided at least on an upper layer side of the filling layer, the first electrode having light transmissivity;
an organic layer provided on an upper layer side of the first electrode, the organic layer comprising at least a light emitting layer; and
a second electrode provided on an upper layer side of the organic layer, the second electrode having light transmissivity,
wherein a coloring material is mixed into the filling layer, and
a lower surface of the first electrode at a position in the recess is positioned lower than a plane that includes the top surface of the base material.

2. The organic electroluminescence device according to claim 1,
wherein an absorption wavelength range of the filling layer overlaps a part of an emission spectrum of light emitted from the light emitting layer.

3. The organic electroluminescence device according to claim 1,
wherein the filling layer includes a resin containing the coloring material and oxide nanoparticles.

4. The organic electroluminescence device according to claim 1,
wherein a refractive index of the filling layer is substantially same as a refractive index of a main component material of the light emitting layer.

5. The organic electroluminescence device according to claim 1,
wherein a refractive index of the filling layer is substantially same as a refractive index of the first electrode.

6. The organic electroluminescence device according to claim 1,
wherein a luminescent color of light emitted from the organic layer has peak wavelengths of at least two or more colors.

7. The organic electroluminescence device according to claim 6,
wherein the light emitting layer emits white light.

8. The organic electroluminescence device according to claim 6,
wherein the light emitting layer comprises a plurality of light emitting units and a charge generating layer, the plurality of light emitting units comprising an electron transporting layer, a light emitting layer, a hole transporting layer, and a hole injecting layer, and
wherein the first light emitting unit, the charge generating layer, and the second light emitting unit are laminated on the first electrode in that order.

9. The organic electroluminescence device according to claim 6,
wherein a coloring component of the filling layer has an absorption spectrum substantially matching a peak wavelength of one color among light emitting components having peak wavelengths of two or more colors.

10. The organic electroluminescence device according to claim 1,
wherein a color filter layer is further provided on the second electrode.

11. The organic electroluminescence device according to claim 1, wherein a part of the reflective layer is in contact with a part of the first electrode.

12. The organic electroluminescence device according to claim 1,
wherein a bottom surface of the first electrode at a position of the recess is positioned lower than a plane including a top surface of the base material.

13. The organic electroluminescence device according to claim 1,
wherein the recess has an arc shape in at least one axial direction.

14. An illumination device comprising:
a base material having a top surface on which a recess is provided;
a reflective layer provided along at least a surface of the recess;
a filling layer filled inside the recess via the reflective layer, the filling layer having light transmissivity;
a first electrode provided at least on an upper layer side of the filling layer, the first electrode having light transmissivity;
an organic layer provided on an upper layer side of the first electrode, the organic layer comprising at least a light emitting layer; and
a second electrode provided on an upper layer side of the organic layer, the second electrode having light transmissivity,
wherein a coloring material is mixed into the filling layer, and
a lower surface of the first electrode at a position in the recess is positioned lower than a plane that includes the top surface of the base material.

15. A display device comprising:
a base material having a top surface on which a recess is provided;
a reflective layer provided along at least a surface of the recess;
a filling layer filled inside the recess via the reflective layer, the filling layer having light transmissivity;
a first electrode provided at least on an upper layer side of the filling layer, the first electrode having light transmissivity;
an organic layer provided on an upper layer side of the first electrode, the organic layer comprising at least a light emitting layer; and
a second electrode provided on an upper layer side of the organic layer, the second electrode having light transmissivity,
wherein a coloring material is mixed into the filling layer, and
a lower surface of the first electrode at a position in the recess is positioned lower than a plane that includes the top surface of the base material.

* * * * *